United States Patent [19]

Isozaki et al.

[11] Patent Number: 4,954,826
[45] Date of Patent: Sep. 4, 1990

[54] DIGITAL CODE CONVERSION APPARATUS

[75] Inventors: Masaaki Isozaki; Kazuhiro Takano, both of Kanagawa, Japan

[73] Assignee: Sony Corporation, Tokyo, Japan

[21] Appl. No.: 136,368

[22] Filed: Dec. 22, 1987

[30] Foreign Application Priority Data

Dec. 27, 1986 [JP] Japan .............................. 61-311604
Feb. 17, 1987 [JP] Japan .............................. 62-033897

[51] Int. Cl.$^5$ .............................................. H03M 9/00
[52] U.S. Cl. ..................................... 341/100; 341/68; 341/101
[58] Field of Search ............. 340/347 DD; 360/39–41, 360/48

[56] References Cited

U.S. PATENT DOCUMENTS

| 4,218,675 | 8/1980 | Shaw et al. ........................... 341/156 |
| 4,672,362 | 7/1987 | Furukawa et al. .................... 360/40 |
| 4,901,076 | 2/1990 | Askin et al. .......................... 341/100 |

FOREIGN PATENT DOCUMENTS

| 1524136 | 7/1970 | Fed. Rep. of Germany . |
| 1549519 | 2/1971 | Fed. Rep. of Germany . |
| 1067981 | 7/1970 | United Kingdom . |

OTHER PUBLICATIONS

Patent Abstracts of Japan, unexamined applns., P field, vol. 9, No. 276, 11/2/85, The Office Japanese Government, p. 162, P 402, Kokai-No. 60-121-572.
Patent Abstracts of Japan, unexamined applns., P field, vol. 9, No. 227, 9/13/85, The Patent Office Japanese Government, p. 27, P 388, Kokai-No. 60-83 261.

Primary Examiner—William M. Shoop, Jr.
Assistant Examiner—Brian Young
Attorney, Agent, or Firm—Philip M. Shaw, Jr., Ltd.

[57] ABSTRACT

A digital code modulation circuit converts input data formed of sequentially received serial data into parallel data such that each parallel data has input data for reference in both preceding and following parallel data, and thereupon applies a code conversion to the parallel data and thereby executes modulation of the input data in parallel. Conversely, a digital code demodulation circuit applies a code conversion to input data formed of serial data sequentially input thereto to form parallel data such that each parallel data has input data for reference in both the preceding and following parallel data and thereby executes demodulation of the input data in parallel.

14 Claims, 13 Drawing Sheets

F I G. 2
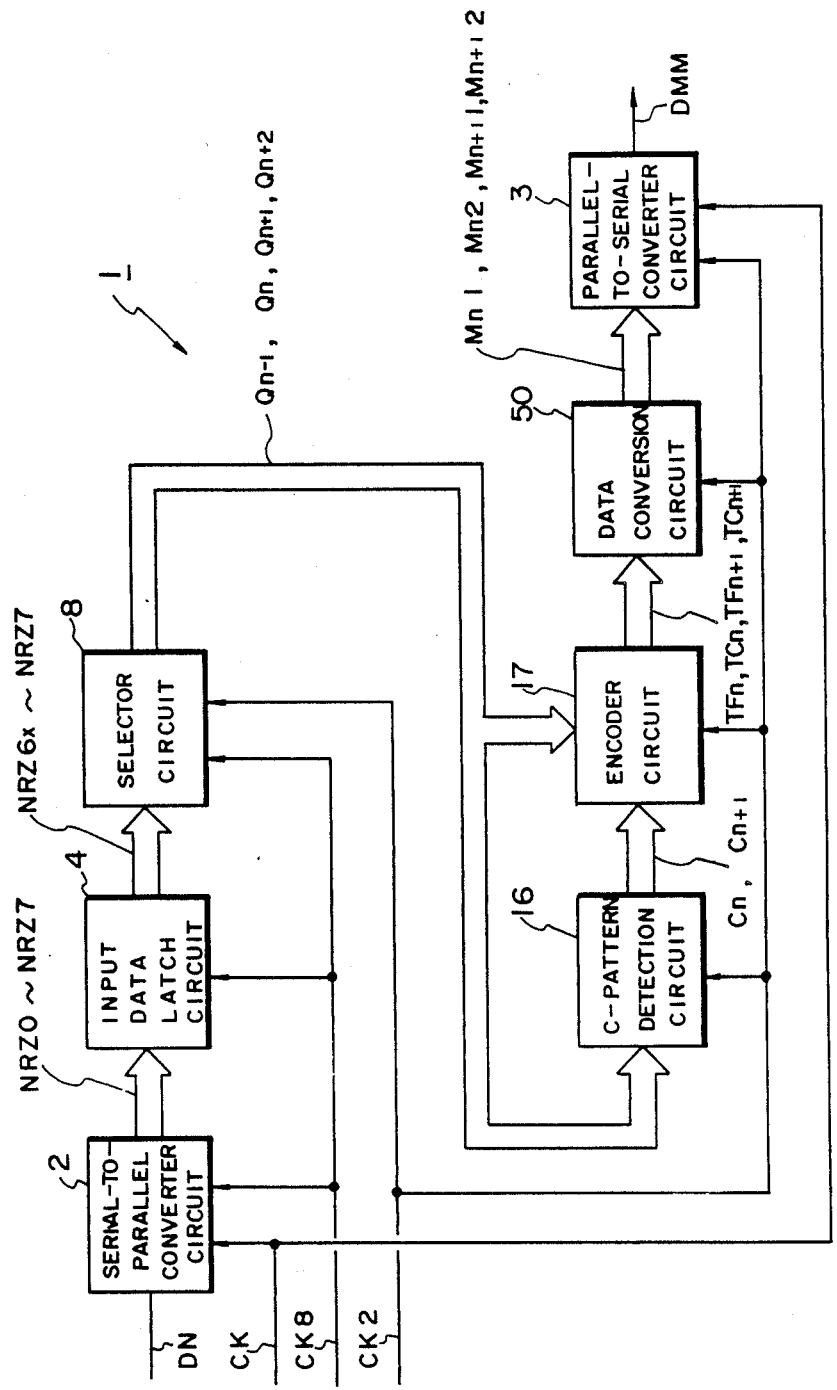

| CK2 | Qn-1 | Qn | Qn+1 | Qn+2 |
|-----|------|------|------|------|
| n-1 | NRZ6x | NRZ7x | NRZ0 | NRZ1 |
| n | NRZ0 | NRZ1 | NRZ2 | NRZ3 |
| n+1 | NRZ2 | NRZ3 | NRZ4 | NRZ5 |
| n+2 | NRZ4 | NRZ5 | NRZ6 | NRZ7 |

FIG.6

| Cn | Qn | Qn+1 | Xn+1 | $\overline{Xn+1}$ |
|---|---|---|---|---|
| 1 | (1) | (0) | 0 | 1 |
| 0 | 0 | 0 | 0 | 1 |
| 0 | 1 | 0 | 0 | 1 |
| 0 | 0 | 1 | 1 | 0 |
| 0 | 1 | 1 | Xn-1 | $\overline{Xn-1}$ |

FIG.7

| Cn | Cn+1 | Qn | Qn+1 | yn+1 |
|---|---|---|---|---|
| 0 | 0 | 0 | 1 | $\overline{yn-1}$ |
| 0 | 0 | 1 | 0 | $\overline{yn-1}$ |
| 0 | 0 | 0 | 0 | yn-1 |
| 0 | 0 | 1 | 1 | yn-1 |
| 1 | 0 | (1) | (0) | 0 |
| 0 | 1 | (1) | (1) | 1 |

FIG.8

| DC0 Qn+2X | DC1 Qn+1X | Qn | Qn+1 | Qn+2 | Cn | Cn+1 |
|---|---|---|---|---|---|---|
| 1 | 0 | 1 | 0 | — | 1 | 0 |
| 1 | 1 | 1 | 1 | 0 | 0 | 1 |

| Cn | Qn-1 | Qn | TFn | TCn |
|---|---|---|---|---|
| 0 | 0 | 0 | 1 | 0 |
| 0 | 1 | 0 | 0 | 0 |
| 0 | 0 | 1 | 0 | 1 |
| 0 | 1 | 1 | 0 | 1 |
| 1 | 1 | 1 | 0 | 0 |

| Cn+1 | Qn | Qn+1 | TFn-1 | TCn+1 |
|---|---|---|---|---|
| 0 | 0 | 0 | 1 | 0 |
| 0 | 1 | 0 | 0 | 0 |
| 0 | 0 | 1 | 0 | 1 |
| 0 | 1 | 1 | 0 | 1 |
| 1 | 1 | 1 | 0 | 0 |

DIGITAL CODE CONVERSION APPARATUS

BACKGROUND OF THE INVENTION

1. Field of the Invention

The present invention relates to a digital code conversion apparatus, and more particularly, to an encoding or decoding apparatus capable of processing a digital code in a parallel manner.

2. Description of the Prior Art

Conventionally, when a digitally encoded video signal or the like is recorded or reproduced on a digital code record/reproduction apparatus such as a digital VTR, it has been the practice, for recording the signal, to convert the signal into a desired signal format by using a digital code modulation circuit, and, for obtaining the original, digitally encoded video signal, the recorded signal is reproduced and converted by using a digital code demodulation circuit.

That is, an analog signal such as a video signal is sampled and sequentially encoded, for example, into eight-bit digital information and then processed by a parallel-to-serial conversion circuit to be turned into serial data in synchronism with a predetermined clock signal.

Then, modulated data in the NRZ (non return to zero) modulation format, in which the logical level is inverted corresponding to the logical level of the aforesaid serial data, is obtained and thereby NRZ data is provided.

Further, there is a modulation method MFM (modified frequency modulation) format which is used to obtain MFM data. According to this MFM format, when a bit cell of NRZ data is at a logical 0, the corresponding logical level is inverted at the timing of the rise of the clock signal only when the logical level of the cell of the NRZ data occurring one clock period prior thereto is at a logical 0 (hereinafter, this will be called the first condition), and when the logical level of a bit cell of the NRZ data is at a logical 1, the corresponding logical level is inverted at the timing of the fall of the clock signal, namely, at that time point in the center of one clock period of the clock signal (hereinafter, this will be called the second condition).

When the signal is recorded on a magnetic tape based upon MFM data, a recorded signal containing only a small quantity of low frequency components can be obtained even if there appears information at the same logical level continuously in the serial data, and also, demodulation is easily made without the need for recording the clock signal at the same time.

However, since the MFM data DM (FIG. 1(A)) contains a D.C. component (i.e. the digital sum value or DSV) as shown in FIG. 1, there has been a problem that, in the case of some video signals, the D.C. component is continuously accumulated and as a result a D.C. level SD (FIG. 1(B)) exhibits a large variation.

To solve the aforementioned problem, the digital code modulation circuit according to the $M^2$ code (modified Miller) format which was proposed in U.S. Pat. No. 3,108,261 is used in digital VTRs, so that the D.C. level will not vary beyond a predetermined value.

That is, in this format, a third condition is provided in addition to the first and second conditions used in the modulation format of the MFM data DM. The third condition is such that, when bit cells of the NRZ data whose logical level is at a logical 1 continuously appear and if the number of continuing bit cells of the NRZ data at a logical 1 is an even number (hereinafter, this will be called the pattern C), transition, or inversion of the logical level of the last bit cell in the following bit cells at "1" is suppressed. This causes the directions of the transitions of the MFM data DM as a whole to be reversed so that the $M^2$ data DMM (FIG. 1(D)) exhibiting a smaller variation in the DC level SD1 (FIG. 1(C)) can be obtained.

When modulating the NRZ data in such a digital code modulation circuit for the $M^2$ data DMM, however, the modulation of each bit cell thereof has to be made based upon the logical levels of the bit cells of the NRZ data input previously and that of the NRZ data input following thereto. Further, in digital code demodulating such $M^2$ data DMM, the signal must be demodulated into NRZ data by exclusive OR operations performed on two bits of the $M^2$ data DMM, and at the same time, the presence or absence of the pattern C must be detected.

Therefore, in a conventional digital code modulation and demodulation circuit of this type, the input data is serially processed in succession. Hence, in the conventional digital code modulation and demodulation circuit for such $M^2$ data DMM, the processing has to use a clock signal having a frequency twice as large as that of the clock signal of the NRZ data.

Since, in reality, the clock frequency of the NRZ data used in VTRs is high, it has been a problem that a clock signal of about 120 MHz, which is two times the frequency of the clock signal in the video signal in the NTSC system, or about 160 MHz in the case of the PAL system, must be used. Further, a clock signal of about 200 MHz is required for processing the NRZ data when special reproduction modes are taken into consideration.

When such a clock frequency is used, it becomes difficult to modulate the digital signal in a stable manner by the use of TTL (transistor transistor logic) and CMOS (complementary metal oxide semiconductor) integrated circuits as used in general logical circuits, and therefore, the digital code modulation and demodulation circuit in digital VTRs has until now been constructed, for example, of an ECL (emitter coupled logic) digital integrated circuit capable of high-speed switching.

But if such a construction is used, the power consumption in the digital calculating modulation circuit becomes great, and as a result it becomes difficult to achieve higher complexity in the integrated circuits. Thus, it has been inevitable that the digital VTR as a whole becomes larger in size, consuming more power, and hence more expensive.

OBJECT AND SUMMARY OF THE INVENTION

An object of the present invention is to provide a digital code conversion apparatus in which prior art difficulties are overcome, and more particularly, to provide a digital code conversion circuit capable of easily converting data of high repetition frequency without using large power consuming, high-speed switching circuitry.

According to the present invention, there is provided a digital code conversion apparatus which comprises conversion circuits for receiving input serial data, for converting the input data at a predetermined clock rate into parallel data which are shifted one after another by a predetermined number of bits, to thereby output parallel data which, at the preceding and the following clock period, have a predetermined number of bits of overlapped data, code conversion circuits for detecting the predetermined number of bits of overlapped data and converting the parallel data into parallel data having a predetermined format, and a parallel-to-serial conversion circuit for converting the formatted parallel data into serial data.

According to the present invention, there is also provided a digital code conversion apparatus which comprises first conversion circuits for receiving input data formed of serial data, for converting the input data into first parallel data shifted by a predetermined number of bits at a predetermined clock rate, and to thereby output second parallel data that at the preceding and the following clock periods has a predetermined number of bits of overlapped data with the first parallel data, code conversion circuits for converting the second parallel data into third parallel data, and using the third parallel data for outputting fourth parallel data formed of predetermined bits within the third parallel data, and second data conversion circuits for shifting the fourth parallel data by a predetermined number of bits for obtaining fifth parallel data, and converting the fifth parallel data into serial data.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 2 is a block diagram showing an embodiment of a digital code modulation circuit according to the present invention;

FIGS. 6, 7 and 8 are tables for explaining the operations of the C-pattern detection circuit;

DETAILED DESCRIPTION OF THE PREFERRED EMBODIMENTS

Figure 1:
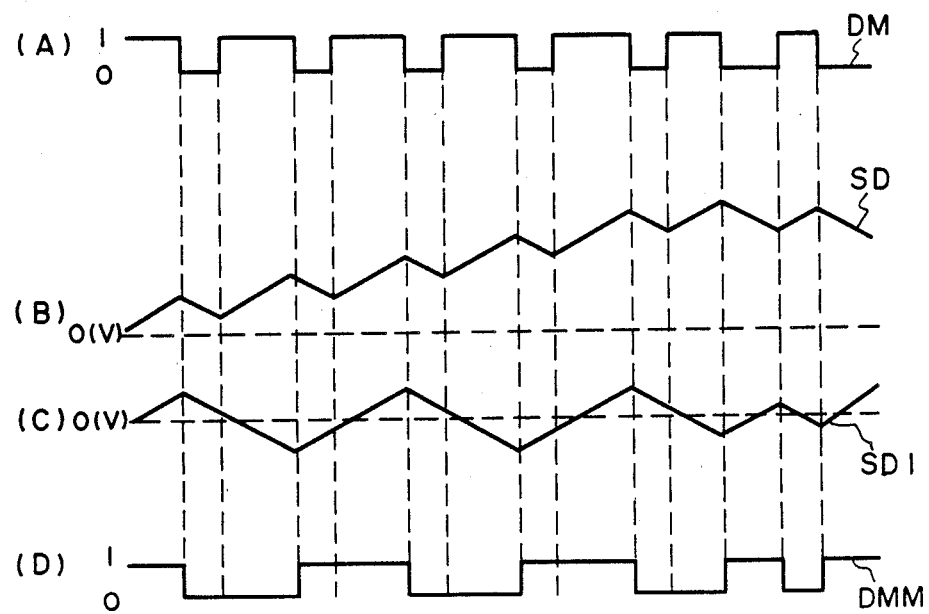
FIGS. 1(A) to 1(D) are signal waveform charts for explaining an example of a code to be converted by a digital code conversion apparatus to which the present invention is applied.

An embodiment of the present invention will be described below in detail according to the accompanying drawings. First, a digital code modulation circuit will be described by using FIGS. 2 to 12.

Referring to FIG. 2, reference numeral 1 denotes a digital code modulation circuit of the present invention as a whole, in which NRZ data DN output in synchronism with the timing of the rise of a clock signal CK is received by a serial-to-parallel converter circuit 2 wherein eight-bit parallel data NRZ0–NRZ7 are cut out from the input data, and then, these parallel data NRZ0–NRZ7 are processed in parallel according to the $M^2$ code and output through a parallel-to-serial converter circuit 3 as $M^2$ code data DMM.

In block form, the digital code modulation circuit comprises the serial-to-parallel converter circuit 2 whose output is supplied to a data latch circuit 4, whose output, in turn, is supplied to a selector circuit 8. A C-pattern detection circuit 16 and an encoder circuit 17 receive the output of the latch circuit 8. Together, the C-pattern detection circuit 16 and the encoder circuit supply the input to a data conversion circuit 50 whose output is converted into serial data by the parallel-to-serial converter 3.

As will be described in greater detail hereinafter, with the arrangement described above, the NRZ data DN is successively cut into eight-bit data in the serial-to-parallel conversion circuit 2 and the same are input, as the parallel data NRZ0–NRZ7, through the latch circuit 4 to the selector circuit 8 at the timing of a clock signal CK8 which is obtained by dividing the clock signal CK for the NRZ data DN by eight.

In the selector circuit 8, the parallel data NRZ0–NRZ7 are cut into four-bit select data $Q_{n-1}$, $Q_n$, $Q_{n+1}$, $Q_{n+2}$, which bits are sequentially shifted by a two-bit interval, and output at the timing of a divided-frequency clock signal CK2, obtained by dividing the clock signal CK by two, to the C-pattern detection circuit 16 and the encoder circuit 17.

In the C-pattern detection circuit 16, two central bits $Q_n$ and $Q_{n+1}$ of the parallel data $Q_{n-1}$, $Q_n$, $Q_{n+1}$, and $Q_{n+2}$ are tested as to whether or not they correspond to the last data whose logical level is at a logical 1 in the pattern C of the NRZ data DN, and based on the result of the test, the transition information $TF_n$, $TC_n$, $TF_{n+1}$, and $TC_{n+1}$ for the parallel data $Q_n$ and $Q_{n+1}$ is obtained by the encoder 17.

In the encoder 17 and the data conversion circuit 50, based on the transition information $TF_n$, $TC_n$, $TF_{n+1}$, and $TC_{n+1}$, the corresponding two-bit M data DMM are divided into four bits through the division of one clock period into a front half and a rear half, whereby parallel $M^2$ data $M_n1$, $M_n2$, $M_{n+1}1$, and $M_{n+1}2$ representative of their logical levels are formed, and are output to the parallel-to-serial conversion circuit 3 which converts them to $M^2$ serial data DMM.

Figure 3:
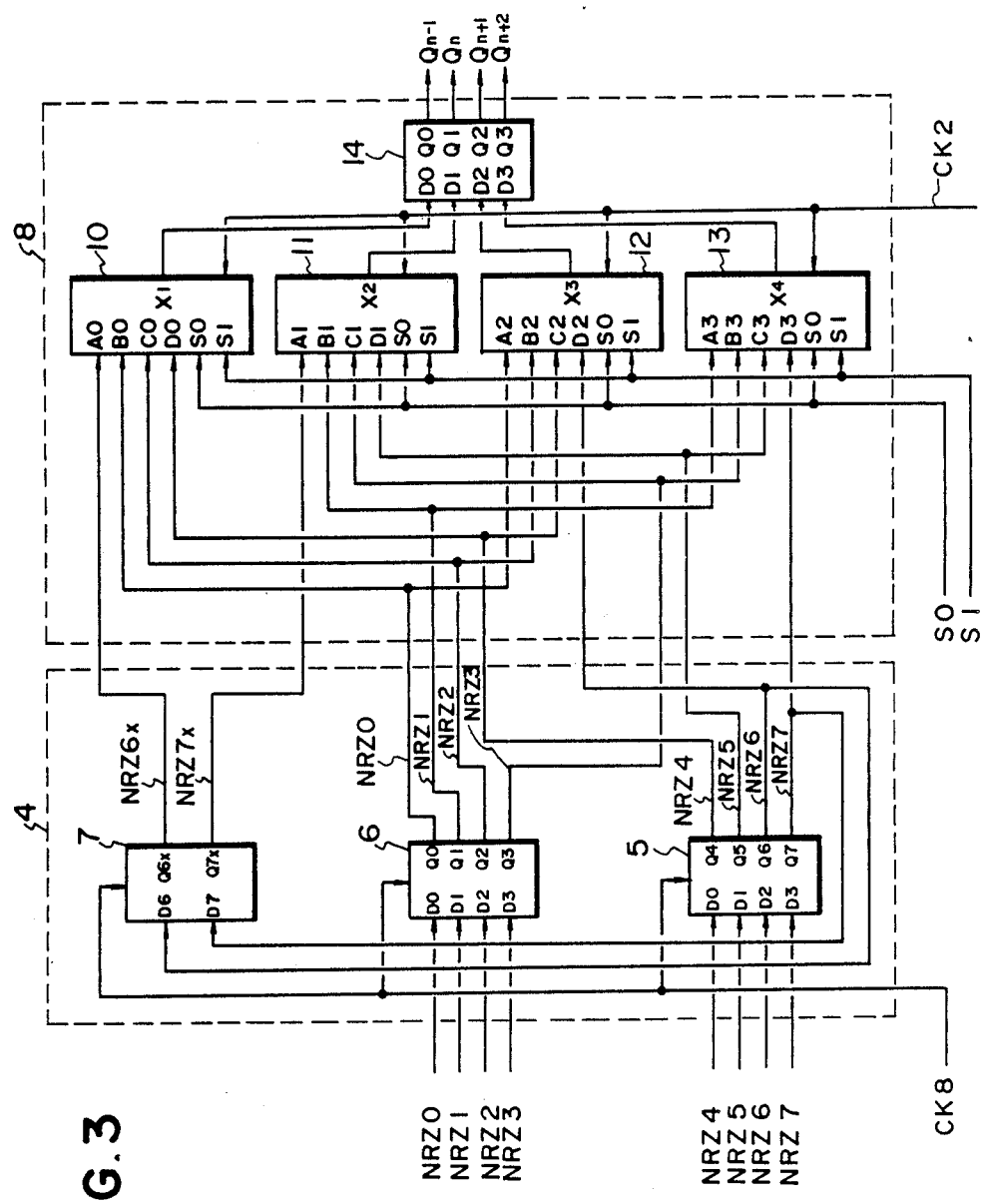
FIG. 3 is a block diagram showing a data latch circuit and a selector circuit.

Referring now to FIG. 3, the data latch circuit 4 is made up of four-bit latch circuits 5 and 6, which latch the parallel data NRZ0–NRZ7 in synchronism with the timing of the clock signal CK8 and a two-bit latch circuit 7.

The latch circuits 5 and 6 are connected to output their latch parallel data NRZ0–NRZ7 to a selector circuit 8 and also output the most significant bit and the bit next thereto of the bits latched by the latch circuit 5

(which consists of the latest two bits of the NRZ data DN input to the serial-to-parallel converter circuit 2 among the parallel data NRZ0–NRZ7) to the selector circuit 8 through the latch circuit 7.

As a consequence of the foregoing, the selector circuit 8 is supplied with the parallel data NRZ0–NRZ7 latched by the latch circuits 5 and 6 and the serial data NRZ6 and NRZ7 latched one clock period prior thereto (hereinafter to be denoted by reference characters NRZ6x and NRZ7x), or 10 bits of serial data NRZ6x–NRZX7.

As shown in FIG. 3, the selector circuit 8 is made up of four-bit data selector circuits 10, 11, 12 and 13 switching their outputs in response to select signals S0 and S1 and a latch circuit 14 operating at the timing of a clock signal CK 2 obtained by dividing the clock signal CK of the NRZ data DN by two.

Input terminals A0, B0, C0, and D0 of the data selector circuit 10 are supplied with the serial data NRZ6x, NRZ0, NRZ2, and NRZ4, respectively, input terminals A1, B1, C1 and D1 of the data selector circuit 11 are supplied with the serial data NRZ7x, NRZ1, NRZ3, and NRZ5, respectively, input terminals A2, B2, C2, and D2 of the data selector circuit 12 are supplied with the serial data NRZ0, NRZ2, NRZ4, and NRZ6, and input terminals A3, B3, C3, and D3 of the data selector circuit 13 are supplied with the serial data NRZ1, NRZ3, NRZ5, and NRZ7, respectively.

Figures 4, 5:
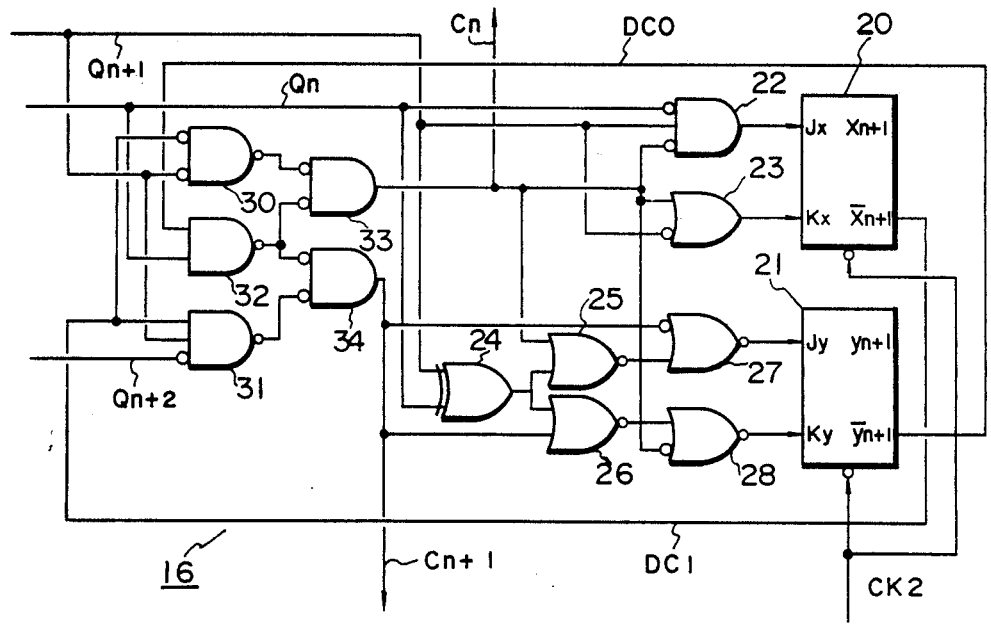
FIG. 4 is a table for explaining the operations of the data latch and the selector circuits depicted in FIG. 3.
FIG. 5 is a block diagram showing a C-pattern detection circuit.

The outputs X1–X4 of the data selector circuits 10, 12, and 13, respectively, are supplied to separate inputs of the latch circuit 14, whereby select data $Q_{n-1}$, $Q_n$, $Q_{n+1}$, and $Q_{n+2}$ are obtained from serial data NRZ6x–NRZ7 as shown in FIG. 4, which select data, formed of four-bit parallel data, each have their bits successively shifted by a two-bit interval at the timing of the rise of the divided-frequency signal CK2 and the select data obtained at the preceding clock period and the next following clock period, together, have two overlapped bits.

In the case of the present embodiment, the select data $Q_n$ and $Q_{n+1}$ are processed in parallel, i.e., at the 1 same time, and $M^2$ data DMM corresponding to the select data $Q_n$ and $Q_{n+1}$ is formed.

For that purpose, the select data $Q_{n-1}$, $Q_n$, $Q_{n+1}$, and $Q_{n+2}$ are output to a C-pattern detection circuit 16 and an encoder circuit 17.

The C-pattern detection circuit 16, based on the select data $Q_{n-1}$ to $Q_{n+2}$ being output thereto in succession, detects whether or not (1) the select data $Q_n$ and $Q_{n+1}$ are the data which correspond to the data appearing at the last pattern C of the NRZ data DN and (2) the logical level thereof is at a logical 1 (i.e., whether or not the third condition is met), and outputs the detection result as C-pattern detection information $C_n$ and $C_{n+1}$, corresponding to the select data $Q_n$ and $Q_{n+1}$, to the encoder circuit 17.

For the aforesaid purpose, as shown in FIG. 5, the C-pattern detection circuit 16 uses counter circuits 20 and 21 formed of a JK flip-flop circuit operating at the timing of the divided-frequency clock signal CK2 for successively counting the numbers of bit cells having a logical 1 and a logical 0 of the select data $Q_n$ and $Q_{n+1}$.

That is, the counter circuit 20 receives the select data $Q_n$ and $Q_{n+1}$ and the C-pattern detection information $C_n$ for the select data $Q_n$ at an input terminal $J_x$ through a tree-input AND circuit 22 and also receives the select data $Q_{n+1}$ and the C-pattern detection information $C_n$ for the select data $Q_n$ at an input terminal $K_x$ through an OR circuit 23. Further, the C-pattern detection information outputs $C_n$ and $C_{n+1}$ for the select data $Q_n$ and $Q_{n+1}$ are input to one input of each of the OR circuits 25 and 26, respectively, and select data $Q_n$ and $Q_{n+1}$ are input to the other input of each of the OR circuits 25 and 26 through an exclusive OR circuit 24.

The C-pattern detection information $C_{n+1}$ for the select data $Q_{n+1}$ is supplied to one input of an OR circuit 27 and the output of the OR circuit 25 is supplied to the other input of the OR circuit 27. The counter circuit 21 receives the output of the OR circuit 27 at an input $J_y$. The output of the OR circuit 26 and the C-pattern detection information $C_n$ for the select data $Q_n$ are supplied to separate inputs of an OR circuit 28 whose output is supplied to an input $K_y$ of the counter circuit 21.

Accordingly, as shown in FIG. 6, when the logical level of the C-pattern detection information $C_n$ is at a logical 1 or the logical level of the select data $Q_{n+1}$ is at a logical 0, the logical level of the non-inverting output $x_{n+1}$ of the counter circuit 20 is set to a logical 0. By contrast, when the logical level of the C-pattern detection information $C_n$ is at a logical 0, the logical level of the non-inverting output $x_{n+1}$ of the counter circuit 20 is set to the logical 1 when the logical levels of the select data $Q_n$ and $Q_{n+1}$ are at a logical 0 and a logical 1, respectively, and the logical level of the non-inverting output $x_{n+1}$ of the counter circuit 20 maintains the logical level (i.e. $X_{n-1}$) existing one clock period of the divided-frequency clock signal CK2 prior thereto when the logical levels of both the select data $Q_n$ and $Q_{n+1}$ are at a logical 1.

As a result, the counter circuit 20 is set when the logical levels of the select data $Q_n$ and $Q_{n+1}$ are set to a logical 0, according to the logical level of the select data $Q_{n+1}$, and then, until the logical level of the select data $Q_n$ or $Q_{n+1}$ becomes a logical 0 again, the counter circuit 20 continues to output a count value of two bits indicating whether the select data $Q_{n+1}$ is the even-numbered data at a logical 1 or the odd-numbered data at a logical 1 from the time when the select data $Q_n$ and $Q_{n+1}$ at a logical 0 were input.

That is, when the select data $Q_{n+1}$ is the even-numbered data at a logical 1 (i.e., in the case where the NRZ data DN at a logical 1 consecutively appear and when the NRZ data DN corresponding to the select data $Q_{n+1}$ is even-numbered data from the NRZ data DN whose logical level was set to a logical 1), the count information $x_{n+1}$ whose logical level is at a logical 0 is provided.

Thus, by detecting whether or not the logical level of the select data $Q_n$ or $Q_{n+1}$ is at a logical 0 when the logical level of the count information $x_{n+1}$ is at a logical 0, it becomes possible to decide whether or not the NRZ data DN corresponding to the select data $Q_{n+1}$ is the even-numbered data at a logical 1 in the NRZ data whose logical levels are consecutively at a logical 1.

On the other hand, when the logical level of the select data $Q_n$ corresponds to the even-numbered data of the NRZ data DN in which logical levels at a logical 1 appear consecutively, the select data $Q_{n+1}$ corresponds to the odd-numbered data of such NRZ data DN or to the data whose logical level is at a logical 0 and the logical level of the count information $x_{n+1}$ becomes a logical 1 or a logical 0.

Thus, when the logical level of the count information $x_{n+1}$ is at a logical 1, it is possible to decide whether or not the NRZ data DN corresponding to the select data $Q_n$ is the even-numbered data in the NRZ data DN whose logical levels are consecutively at logical 1 by detecting whether or not the logical level of the select data $Q_n$ is at a logical 0.

Meanwhile, as shown in FIG. 7, the non-inverting output $y_{n+1}$ of the counter 21 is set to a logical 0, or a logical 1, when the C-pattern detection information $C_n$, or $C_{n+1}$, for the select data $Q_n$, or $Q_{n+1}$, is a logical 1.

In the case where the logical level of the C-pattern detection information $C_n$ and $C_{n+1}$ are at a logical 0, the logical level existing one clock of the divided-frequency clock signal CK2 prior thereto is inverted when the logical level of the select data $Q_n$ and $Q_{n+1}$ do not agree with each other, whereas the logical level existing one clock of the divided-frequency clock signal CK2 prior thereto is maintained only when the logical level of the select data $Q_n$ and $Q_{n+1}$ agree with each other.

As a result, the count information $y_{n+1}$ set to a logical 0 when the logical level of the C-pattern detection information $C_n$ was at a logical 0 maintains that logical level for as long as the logical level of the select data $Q_n$ and $Q_{n+1}$, successively output at the timing of the divided-frequency clock signal CK2, remain at a logical 0 or a logical 1.

When the logical level of the C-pattern detection information $C_{n+1}$ was set to a logical 1, then, after the logical level of the count information $y_{n+1}$ has been set to a logical 1, the logical level is inverted to a logical 0 when the logical level of the select data $Q_n$ or $Q_{n+1}$ is set to a logical 0, whereas the logical level is maintained unchanged for as long as the logical level of the select data $Q_n$ and $Q_{n+1}$ are held at the same level.

As a consequence of the foregoing, when the logical level of the count information $y_{n+1}$ is at a logical 0 while the logical level of the count information $x_{n+1}$ is at a logical 1, it can be assured the NRZ data DN, corresponding to the select data $Q_{n+1}$, is the even-numbered data in the NRZ data DN whose logical levels continue to be at a logical 1.

Similarly, when the logical level of the count information $y_{n+1}$ is at a logical 0 while the logical level of the count information $x_{n+1}$ is at a logical 0, it can be detected that the NRZ data DN, corresponding to the select data $Q_{n+1}$, is the odd-numbered data in the NRZ data DN whose logical levels continue to be at a logical 1.

The C-pattern detection circuit 16 receives this count information DC1 constituted of the signal output $x_{n+1}$ obtained from the inverting output of the counter circuit 20 at one input of a three-input AND circuit 31, which also receives select data $Q_{n+1}$ and $Q_{n+2}$ at two other separate inputs, and at one input of a two-input AND circuit 30, which also receives the select data $Q_{n+1}$ at another input.

The C-pattern detection circuit 16, further, receives count information DC0 constituted of the signal of the count information $y_{n+1}$ obtained from the inverting output of the counter circuit 21 at one input of a two-input AND circuit 32, which also receives the select data $Q_n$ at its other input. The outputs of the AND circuits 30 and 32 are supplied to separate inputs of a two-input AND circuit 33, whose output is $C_n$. In this way the C-pattern detection information $C_n$ for the select data $Q_n$ is obtained, and this is output to separate inverting inputs of the AND gate 22 and the OR gate 28, the noninverting input of the OR gate 23, and also to the encoder circuit 17.

Similarly, the outputs of the AND circuits 31 and 32 are supplied to separate inputs of a two-input AND circuit 34 whose output is the C-pattern detection information $C_{n+1}$ for the select data $Q_{n+1}$. This is output to the inverting input of the OR circuit 27, the noninverting input of the OR gate 26, and also to the encoder circuit 17.

Therefore, as shown in FIG. 8, the logical level of the C-pattern detection information $C_n$ rises to a logical 1 when the logical levels of the count information DC0 and DC1 are at a logical 1 and a logical 0, respectively, and the logical levels of the select data $Q_n$ and $Q_{n+1}$ are at a logical 1 and logical 0, respectively.

On the other hand, the logical level of the C-pattern detection information $C_{n+1}$ for the select data $Q_{n+1}$ rises to a logical 1 when the logical levels of the count information DC1 and DC2, and of the select data $Q_n$, $Q_{n+1}$, and $Q_{n+2}$ are, respectively, at a logical 1, a logical 1, a logical 1, a logical 1, and a logical 0.

At this time, the count information DC1 and DC0 input to the AND circuits 30, 31, and 32 are output from the counter circuits 20 and 21 for the select data $Q_n$, $Q_{n+1}$, and $Q_{n+2}$ as delayed by one clock period of the divided-frequency signal CK2, and as a result, the count information DC1 and DC0 come to represent count information for the select data $Q_{n+1x}$ and $Q_{n+2x}$ at the timing of one clock period prior thereto corresponding to the serial data $Q_n$, $Q_{n+1}$, and $Q_{n+2}$ as indicated in FIG. 8.

Therefore, based upon the count information DC1 and DC0, it is possible to detect for certain whether the NRZ data DN corresponding to the select data $Q_{n+1x}$ and $Q_{n+2x}$ is the odd-numbered data or the even-numbered data in the NRZ data DN whose logical levels continue to be at a logical 1, and hence, by detecting the logical 1 state of the C-pattern detection information $C_n$ or $C_{n+1}$ by using the count information DC1 and DC0, it can be determined for certain whether or not the select data $Q_n$ and $Q_{n+1}$ are the data meeting the third condition for the NRZ data DN (i.e., corresponding to the last NRZ data of even number of the data whose logical level has been consecutively at a logical 1).

The encoder circuit 17 processes the select $Q_{n-1}$, $Q_n$, $Q_{n+1}$, and $Q_{n+2}$ in parallel, i.e. at the same time, using the C-pattern detection information $C_n$ or $C_{n+1}$ output from the C-pattern detection circuit 16 and provides transition information $TF_n$, $TC_n$, $TF_{n+1}$, and $TC_{n+1}$ indicating the rise and fall of the logical levels when converting the NRZ data DN corresponding to the select data $Q_n$ and $Q_{n+1}$ into $M^2$ data.

Figure 9:
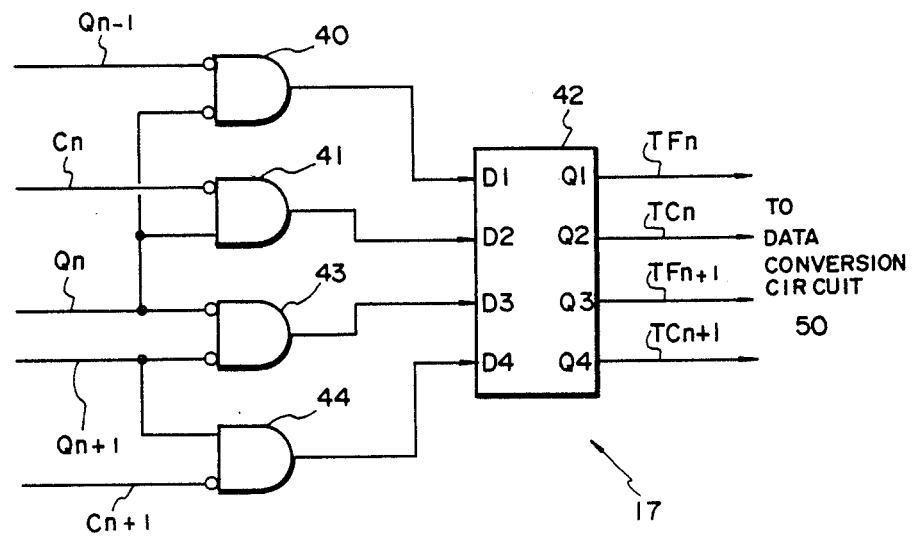
FIG. 9 is a block diagram showing an encoder circuit.

That is, as shown in FIG. 9, a set of the select data $Q_{n-1}$ and $Q_n$ are supplied to separate inputs of an AND gate 40 and a set of the select data $Q_n$ and the C-pattern detection information $C_n$ are supplied to separate inputs of an AND gate 41. The outputs of the AND gates 40 and 41 are supplied, respectively, to two-bit inputs D1 and D2 of a gate circuit 42 formed of four-bit D flip-flop circuits operating at the timing of the divided-frequency clock signal CK2, and thereby, the transition information $TF_n$ and $TC_n$ corresponding to the select data $Q_n$ are obtained.

Figures 10, 11, 12:
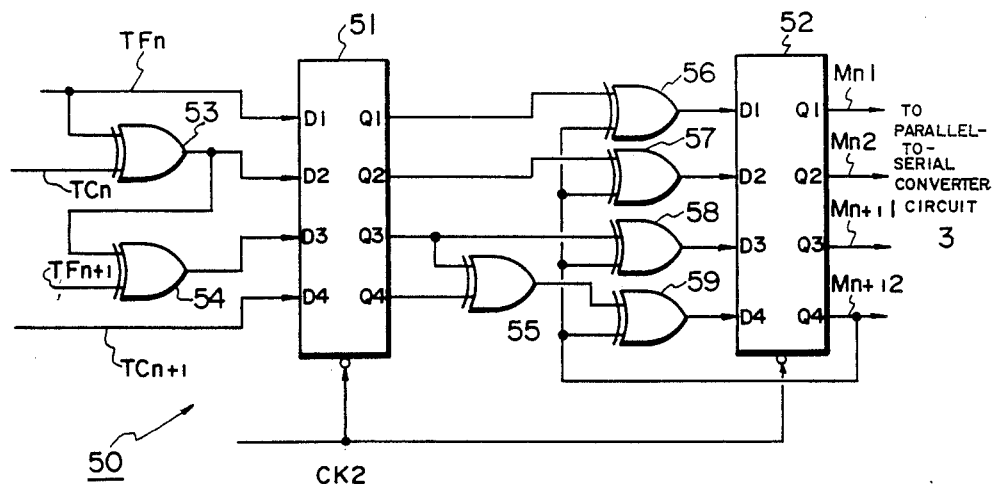
FIGS. 10 and 11 are tables for explaining the operations of the encoder circuit.
FIG. 12 is a block diagram showing a data conversion circuit.

As a result, as shown in FIG. 10, if the logical level of the select data $Q_{n-1}$ is at a logical 0 when the logical level of the select data $Q_n$ is at a logical 0, then the logical level of the leading edge transition information $TF_n$, is caused to rise to a logical 1, which indicates that the logical level of the $M^2$ data DMM corresponding to the select data $Q_n$ is inverted at the timing of rise of the one clock period prior thereto. At the same time, the mid-bit cell transition information $TC_n$, is caused to change to a logical 0, which indicates that the logical level is inverted at the time point in the middle of the one clock period.

The foregoing means that the leading edge transition information $TF_n$ is obtained, which indicates that the data following the NRZ data corresponding to the select data $Q_n$ is data at a logical 0, meeting the first condition in the conversion to the $M^2$ data DMM, and therefore, the logical level of the corresponding $M^2$ data DMM is inverted at the timing of the rise of the clock signal CK.

When the logical levels of the select data $Q_{n-1}$ and $Q_n$ are at a logical 1 and a logical 0, respectively, the transition information $TF_n$ and $TC_n$ are both at a logical 0.

This means that the logical level of the NRZ data DN corresponding to the select data $Q_n$ is at a logical 0 and the logical level of the preceding NRZ data DN is at a logical 1, and therefore, any of the first, second, and third conditions is not met and the logical level of the $M^2$ data DMM corresponding to the select data $Q_n$ is not inverted.

When the logical levels of the select data $Q_{n-1}$ and $Q_n$ are at a logical 0 and a logical 1, respectively, the logical level of the mid-bit cell transition information $TC_n$ is caused to rise to a logical 1.

This means that the logical level of the NRZ data DN corresponding to the select data $Q_n$ is at a logical 1 and the logical level of the data one clock period prior thereto is at a logical 0, and therefore, the second condition is met and the mid-bit cell transition information $TC_n$ indicating that the logical level of the corresponding $M^2$ data DMM is inverted at the timing of the fall of the clock signal CK is obtained.

When the logical levels of the select data $Q_{n-1}$ and $Q_n$ are at a logical 1 while the logical level of the C-pattern detection information $C_n$ is at a logical 0, the logical level of the mid-bit cell transition information $TC_n$ is caused to rise to a logical 1.

This means that the logical level of the NRZ data DN corresponding to the select data $Q_n$ is at a logical 1, being in the middle of the NRZ data whose logical levels are consecutively at a logical 1, and so, the second condition is met and the mid-bit cell transition information $TC_n$ indicating that the logical level of the corresponding $M^2$ data DMM is inverted at the timing of the fall of the clock signal CK is obtained.

When the logical levels of the select data $Q_{n-1}$ and $Q_n$ are at a logical 1 and the logical level of the C-pattern detection information $C_n$ is caused to rise to a logical 1, the logical levels of the transition information $TF_n$ and $TC_n$ become a logical 0.

This is the case where the NRZ data DN, corresponding to the select data $Q_n$, is the last NRZ data DN whose logical level is at a logical 1 in the pattern C, and therefore, the third condition in the data conversion into the $M^2$ data DMM is met and the $M^2$ data DMM corresponding to the select data $Q_n$ is not inverted.

Further, in the encoder circuit 17, a set of the select data $Q_n$ and $Q_{n+1}$ are supplied to separate inputs of an AND gate 43 and a set of the select data $Q_{n+1}$ and the C-pattern detection information $C_{n+1}$ are supplied to the separate inputs of an AND gate 44. The outputs of the AND circuits 43 and 44 are supplied to the separate, remaining two-bit D flip-flop circuits D3 and D4 of the gate circuit 42, and thereby the transition information $TF_{n+1}$ and $TC_{n+1}$ corresponding to the select data $Q_{n+1}$ are obtained as outputs.

As shown in FIG. 11, the transition information $TF_{n+1}$ and $TC_{n+1}$ for the $M^2$ data DMM corresponding to the select data $Q_{n+1}$ to be used in the conversion of the NRZ data DN to the $M^2$ data DMM are formed similarly to the case for the select data $Q_n$. As shown in FIG. 2, these data are delivered to a data conversion circuit 50 together with the transition information $TF_n$ and $TC_n$ for the $M^2$ data DMM corresponding to the select data $Q_n$.

The data conversion circuit 50, as shown in FIG. 12, processes the transition information $TF_n$, $TF_{n+1}$, $TC_n$, and $TC_{n+1}$, in parallel, i.e., at the same time, and provides data $M_n1$, $M_n2$, $M_{n+1}1$, and $M_{n+1}2$ (hereinafter, to be called parallel $M^2$ data), which represent the logical levels at the front half and the rear half of one clock period of the $M^2$ data DMM corresponding to the select data $Q_n$ and $Q_{n+1}$.

The data conversion circuit 50 includes gate circuits 51 and 52, each made up of four D flip-flop circuits operating at the timing of the divided-frequency clock signal CK2, and therein, the leading edge transition information $TF_n$ out of the transition information $TF_n$ and $TC_n$, which is formed based upon the select data $Q_n$, is received at an input D1 by the first D flip-flop circuit of the gate circuit 51, while the leading edge transition information $TF_n$ and the mid-bit cell transition information $TC_n$ are supplied to separate inputs of an exclusive OR circuit 53 whose output is supplied to an input D2 of the second D flip-flop circuit of the gate circuit 51.

The leading edge transition information $TF_{n+1}$ of the transition information $TF_{n+1}$ and $TC_{n+1}$, which is formed based upon the select data $Q_{n+1}$, and the output of the exclusive OR circuit 53 are supplied to separate inputs of an exclusive OR circuit 54 whose output is supplied to an input D3 of the third D flip-flop circuit of the gate circuit 51. The mid-bit cell transition information $TC_{n+1}$ is received at an input D4 by the remaining fourth D flip-flop circuit of the gate circuit 51.

The outputs Q3 an Q4 of the third and fourth D flip-flop circuits, respectively, of the gate circuit 51 are supplied to separate inputs of an exclusive OR circuit 55.

By virtue of the above described arrangement, output data varying in correspondence with the logical level of the leading edge transition information $TF_n$, based upon the select data $Q_n$, is obtained from the output Q1 of the first D flip-flop circuit, and a corresponding output, but in which the logical level thereof varies as a function of the mid-bit cell transition information $TC_n$, is obtained at the output Q2 from the second D flip-flop circuit.

Further, an output corresponding to the output of the second D flip-flop circuit, but whose logical level varies as a function of the leading edge transition information $TF_{n+1}$ for the following select data $Q_{n+1}$, is obtained at the output Q3 from the third D flip-flop circuit, and a corresponding output, but whose logical level varies as a function of the mid-bit cell transition information $TC_{n+1}$ for the select data $Q_{n+1}$, is obtained from the output of the exclusive OR circuit 55.

The outputs of the first, second, and third D flip-flop circuits of the gate circuit 51 and the output of the exclusive OR circuit 55 are separately supplied, respectively, to one input of the exclusive OR circuits 56, 57, 58, and 59, which exclusive OR circuits receive the output of a fourth D flip-flop circuit of a gate circuit 52 at their other inputs. The outputs of the exclusive OR circuits 56, 57, 58, and 59 are supplied to the separate inputs D1, D2, D3, and D4 of the four D flip-flop circuit 52. The outputs of the first, second, third, and fourth D flip-flop circuits are delivered to the parallel-to-serial conversion circuit 3 as parallel $M^2$ data $M_n1$, $M_n2$, $M_{n+1}1$, and $M_{n+1}2$.

Consequently, the logical levels of the parallel $M^2$ data $M_n1$, $M_n2$, $M_{n+1}1$ and $M_{n+1}2$ correspond to the logical level of the parallel $M^2$ data $M_{n+1}2$ output from the fourth D flip-flop circuit one clock period prior thereto but their logical levels are inverted dependent upon the outputs of the first, second, and third D flip-flop circuits of the gate circuit 51 and the output of the gate circuit 55.

Thus, the NRZ data DN is converted to $M^2$ data DMM according to the first, second, and third conditions for the conversion, and further, two bits of the $M^2$ data DMM are represented by four bits of the parallel $M^2$ data $M_n1$, $M_n2$, $M_{n+1}1$, and $M_{n+1}2$ through the division of one clock period into a front half and a rear half and output at the timing of the divided-frequency clock signal CK2, i.e. half the clock frequency of the clock signal CK of the NRZ data DN.

Therefore, the C-pattern detection circuit 16, encoder circuit 17, and the data conversion circuit 50 operate as a code conversion circuit which, referring to the select data $Q_{n-1}$ and $Q_{n+2}$, converts the select data $Q_n$ and $Q_{n+1}$ into parallel data of the predetermined $M^2$ code.

The parallel-to-serial conversion circuit 3 reads the parallel $M^2$ data $M_n1$, $M_n2$, $M_{n+1}1$, and $M_{n+1}2$ at the timing of the divided-frequency clock signal CK2, and thereafter, sequentially outputs the serial $M^2$ data $M_n1$, $M_n2$, $M_{n+1}1$, and $M_{n+1}2$ as the $M^2$ data DMM at the timing of the rise and fall of the clock signal CK of the NRZ data DN.

According to the arrangement described above, NRZ data formed of serial data are first converted into parallel data to be code conversion processed in parallel and then converted back to serial data, in order that $M^2$ data can thereby obtained. It is thereby possible to parallel process data at processing speeds as slow as ¼ and ½ of the clock frequency of the input data.

In practice, while a 160 MHz clock frequency of a digital VTR in the PAL system has been required in the data latch circuit 4, the circuit according to the present invention can be operated at just the timing of the clock signal CK8 which is one-eighth of the clock signal CK (the clock frequency of the input data in the present case is 80 MHz), i.e., of 10 MHz or so.

The selector circuit 8, C-pattern detection circuit 16, encoder circuit 17, and the data conversion circuit 50 operate at the timing of the divided-frequency clock signal CK2, so the clock frequency required is 40 MHz.

Although the case where the NRZ data is successively cut into eight-bit data was mentioned in the embodiment described above, the present invention is not limited to that but cutting the data into 16-bit data can also be practiced.

And although in the embodiment described above, the case was mentioned where four bits of select data $Q_{n-1}$, $Q_n$, $Q_{n+1}$, and $Q_{n+2}$, sequentially shifted by a two-bit interval, are selected from the cut out eight-bit parallel data for simultaneous, parallel processing, the present invention is not limited to that, but, for example, six bits of select data, sequentially shifted by a two-bit interval, can be taken out and the select data for four bits can be processed in parallel, at the same time.

Now the digital code demodulation circuit will be described with reference to FIGS. 13–17.

The $M^2$ data DMM is obtained by modulation of the NRZ data DN according to the first, second, and third conditions. When the first and second conditions are considered, demodulation of the $M^2$ data DMM to the NRZ data DN will be achieved by dividing the $M^2$ data DMM into two-bit sections (hereinafter such a section will be called a window) and by obtaining exclusive logical sums of such divided two bits.

But, if the third condition is considered in addition to the first and second conditions, supposing there is a logic pattern of 1, 1, 0 (i.e., a pattern C) in the NRZ data DN, the NRZ data DN at a logical 1 in the center was inhibited from inverting its logical level when it was modulated, and therefore, when the $M^2$ data DMM is demodulated to the NRZ data DN, it is required to accurately detect whether or not the $M^2$ data DMM being processed is data that was modulated in the pattern C in the NRZ data DN.

Now, assuming that the $M^2$ data DMM is in the right window, six bits of the $M^2$ data DMM which are modulated from the last three bits in the pattern C of the NRZ data DN (hereinafter, these bits will be called the C-pattern end) will be either of two types of trains of bits: logical 0, 1, 1, 1, 1, 1, or logical 1, 0, 0, 0, 0, 0. Correct demodulation of the $M^2$ data DMM to the NRZ data DN can be achieved by unconditionally making the central two bits a logical 1 during demodulating to the NRZ data DN.

In order to set up the right window, attention is paid to the case where a train of bits at logical 1, 0, 1 appear in the NRZ data DN. That is, except for the case where the NRZ data DN is in the pattern C, if three bits in a train of bits in the NRZ data DN are at logical 1, 0, 1, then, at the time the NRZ data DN is modulated to the $M^2$ data DMM, the corresponding train of six bits in the $M^2$ data DMM will be either of the following two types: logical 1, 0, 0, 0, 0, 1 or logical 0, 1, 1, 1, 1, 0. Since there is only one way of setting up the window in such a case, the window setting can be renewed by detecting such trains of six bits in the $M^2$ data DMM.

The renewal of the window setting can be executed in the following manner. That is, when, for example, a six-bit bit train in the $M^2$ data DMM is represented by QM0, QM1, QM2, QM3, QM4, and QM5, exclusive logical sums of the adjoining two, i.e., QM0 and QM1, QM1 and QM2, QM2 and QM3, QM3 and QM4, and QM4 and QM5, are obtained and thereby five-bit output data G0, G1, G2, G3, and G4 are provided. When these are at logical 1, 0, 0, 0, 1, the output data G0, G2, and G4 are obtained as the NRZ data DN.

As described above, six bits of the $M^2$ data DMM are required to execute the window detection and the C-pattern detection. For example, in order to demodulate two bits of QM2 and QM3 of the $M^2$ data DMM to one bit of the NRZ data DN, six bits of the $M^2$ data DMM, i.e. QM0, QM1, QM2, QM3, QM4, and QM5, are necessary. Therefore, to correctly demodulate four bits of $M^2$ data DMM to two bits of the NRZ data DN, nine bits of the $M^2$ data DMM, i.e. QM0–QM8, are required when it is necessary to test for incorrect window settings.

That is, when, for example, four bits of the $M^2$ data QM2, QM3, QM4, and QM5 are to be demodulated to obtain two bits of the NRZ data DN, either the NRZ data DN, QA and QB, demodulated from the combination of QM2 and QM3 and the combination of QM4 and QM5 of the M² data DMM or the NRZ data DN, QC and QD, demodulated from the combination of QM3 and QM4 and the combination of QM5 and QM6 of the M² data DMM, is selectively used according to the corrections of the window setting.

Here, the M² data QM0–QM5 are used for obtaining the NRZ data QA, the M² data QM2–QM7 are used for obtaining the NRZ data QB, the M² data QM1–QM6 are used for obtaining the NRZ data QC, and the M² data QM3–QM8 are used for obtaining the NRZ data QD. Thus, by using six bits each of the M² data DMM, the C-pattern detection and the window detection can be executed and correct NRZ data DN can be obtained.

As described above, the M² data DMM in the C-pattern end are at logical 0, 1, 1, 1, 1, 1 or at logical 1, 0, 0, 0, 0, 0, and so, if the exclusive logical sums of the adjoining bits therein are obtained, one combination of logical levels 1, 0, 0, 0, 0 is obtained.

Therefore, by having the outputs of exclusive logical sums of the adjoining bits in nine bits of the M² data QM0–QM8, or of QM0 and QM1, QM1 and QM2, QM2 and QM3, QM3 and QM4, QM4 and QM5, QM5 and QM6, QM6 and QM7, QM7 and QM8, represented by output data G0, G1, G2, G3, G4, G5, G6, and G7, respectively, if the train of bits of the output data G0, G1, G2, G3, and G4 is at logical 1, 0, 0, 0, 0 when the NRZ data QA is obtained, then the NRZ data QA is determined to be the C-pattern end and the logical level of the NRZ data QA is set to a logical 1. If the train of bits of the output data G2, G3, G4, G5 and G6 is a logical 1, 0, 0, 0, 0 when obtaining the NRZ data QB, then the NRZ data QB is decided to be the C-pattern end and the logical level of the NRZ data QB is set to a logical 1. And, in like manner, if the train of bits G1–G5 or that of G3–G7 is at logical 1, 0, 0, 0, 0 when obtaining the NRZ data QC or QD, they are determined to be the C-pattern end and the NRZ data QC or QD is set to a logical 1.

As described in the foregoing, the correct window setting is detected for certain when the combination of the logical 1, 0, 1 is included in the train of bits of the NRZ data DN, that is, when five-bit output data formed of the exclusive logical sums of adjoining bits of a six-bit bit train in the M² data DMM is at logical 1, 0, 0, 0, 1.

Therefore, by having the exclusive logical sums of the adjoining bits QM0–QM8 in the nine bits of the M² data represented by output data G0–G7, when either five-bit data of the output data G0–G4 or G2–G6 is a combination of logical 1, 0, 0, 0, 1, the NRZ data QA and QB are taken as the correct combination of the NRZ data DN, whereas when either five bits of the output data G1–G5 or G3–G7 is a combination of logical 1, 0, 0, 0, 1, the NRZ data QC and QD are taken as the correct combination of the NRZ data DN.

Figure 13:
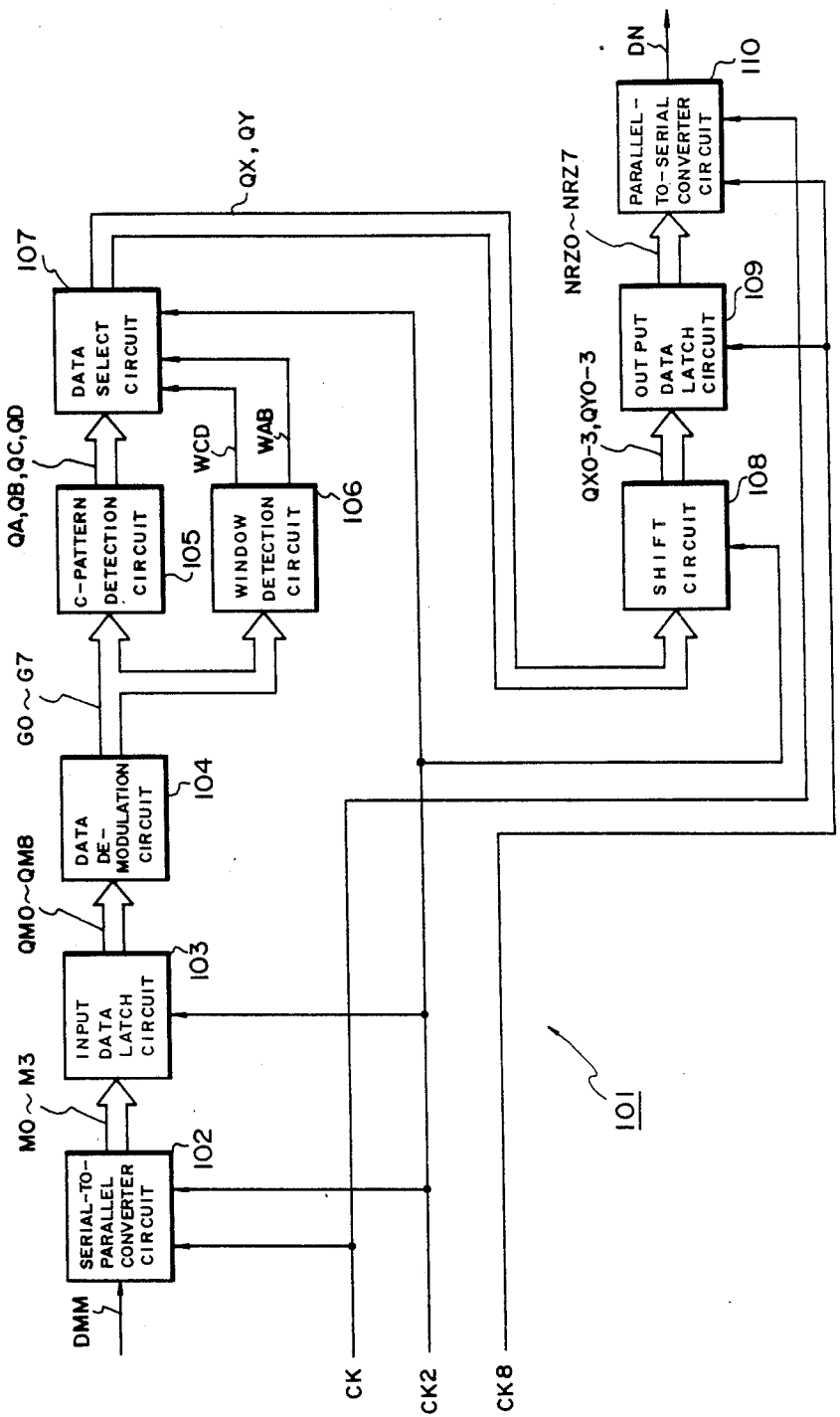
FIG. 13 is a block diagram showing an embodiment of a digital code demodulation circuit according to the present invention.

Referring to FIG. 13, reference numeral 101 denotes a digital code demodulation circuit as a whole, and the input M² data DMM, which is serial data obtained at the timing of the rise and fall of the fundamental clock CK for the NRZ data DN, is converted in a serial-to-parallel conversion circuit 102 into four-bit M² data M0, M1, M2, and M3 provided at the timing of the rise of the first clock CK2 formed by dividing the fundamental clock CK for the NRZ data DN by two.

The M² data M0, M1, M2, and M3 are processed in parallel in two-bit blocks according to the NRZ format while being passed through an input data latch circuit 103, data demodulation circuit 104, C-pattern detection circuit 105 and window detection circuit 106, data select circuit 107, and a shift circuit 108. Thereafter, NRZ data for four periods of the first clock CK2, i.e., of eight bits, NRZ0, NRZ1, ..., NRZ6, NRZ7, is latched in the output data latch circuit 109, and finally, the data is demodulated in a parallel-to-serial conversion circuit 110, to become the NRZ data DN in the form of serial data provided at the timing of the rise of the fundamental clock CK.

Figure 14:
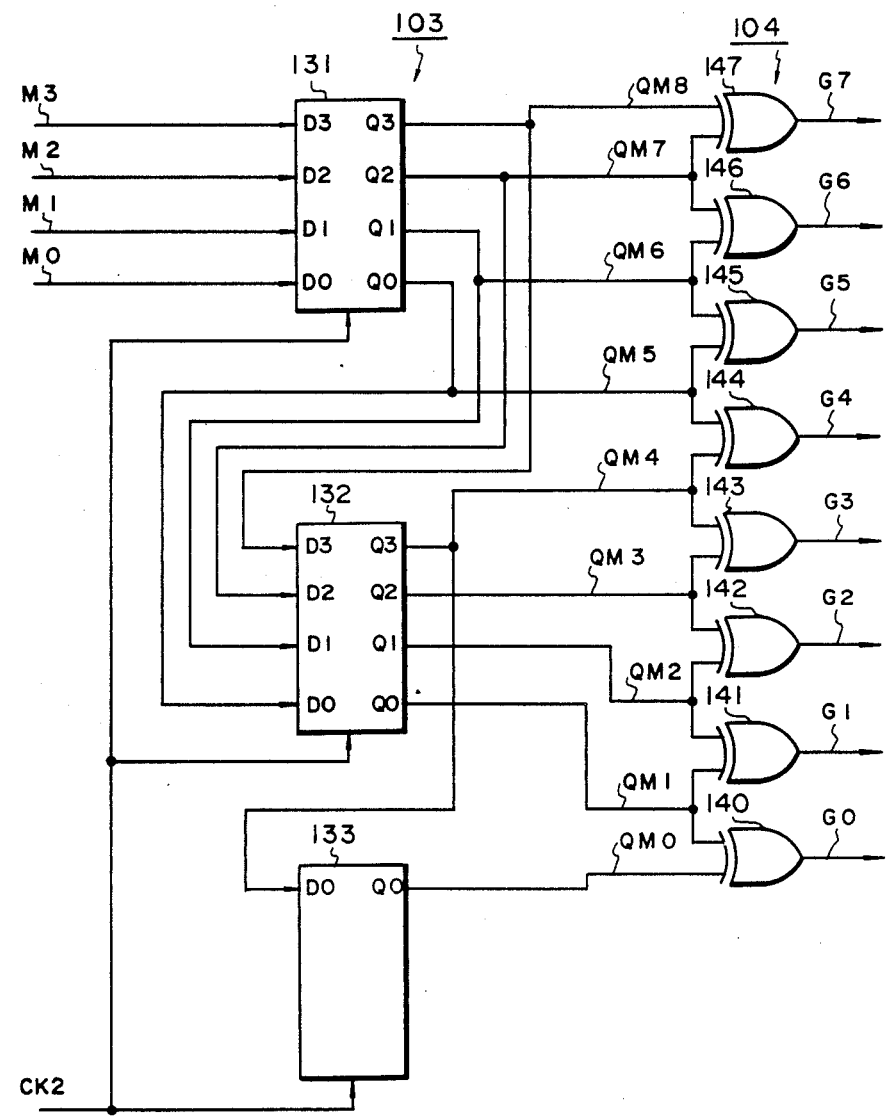
FIG. 14 is a block diagram showing an input data latch circuit and a data demodulation circuit for the digital code demodulation circuit.

The input data latch circuit 103 and the data demodulation circuit 104 are shown in more detail in FIG. 14. The input data latch circuit 103 latches the input parallel data, i.e., M² data M0, M1, M2, and M3 in a first four-bit latch circuit 131 in synchronism with a rise of the first clock CK2, and latches the output of the first latch circuit 131 in a second four-bit latch circuit 132 in synchronism with the succeeding rise of the first clock CK2, and further, latches the fourth output Q3 of the second latch circuit 132 in a one-bit third latch circuit 133 in synchronism with the folloWing rise of the first clock CK2.

Thereby, the input data latch circuit 103 delivers the four bits of the latch output Q0, Q1, Q2, and Q3 of the latch circuit 131, together with five bits of M² data previously latched in the second and third latch circuits 132 and 133, all together totaling nine bits of parallel data, QM0, QM1, QM2, QM3, QM4, QM5, QM6, QM7, and QM8 to the data demodulation circuit 104.

The data demodulation circuit 104 comprises a plurality of exclusive OR gates 140–147 connected to receive the outputs of the latches 131, 132, and 133 in such a manner as to obtain exclusive OR products of the adjoining bits in the nine-bit parallel data QM0, QM1, ..., QM7, QM8 received from the input data latch circuit 103, and thereby provides 8-bit demodulated data G0, G1, G2, G3, G4, G5, G6, and G7 as the outputs of the exclusive OR gates 140–147, respectively.

Figure 16:
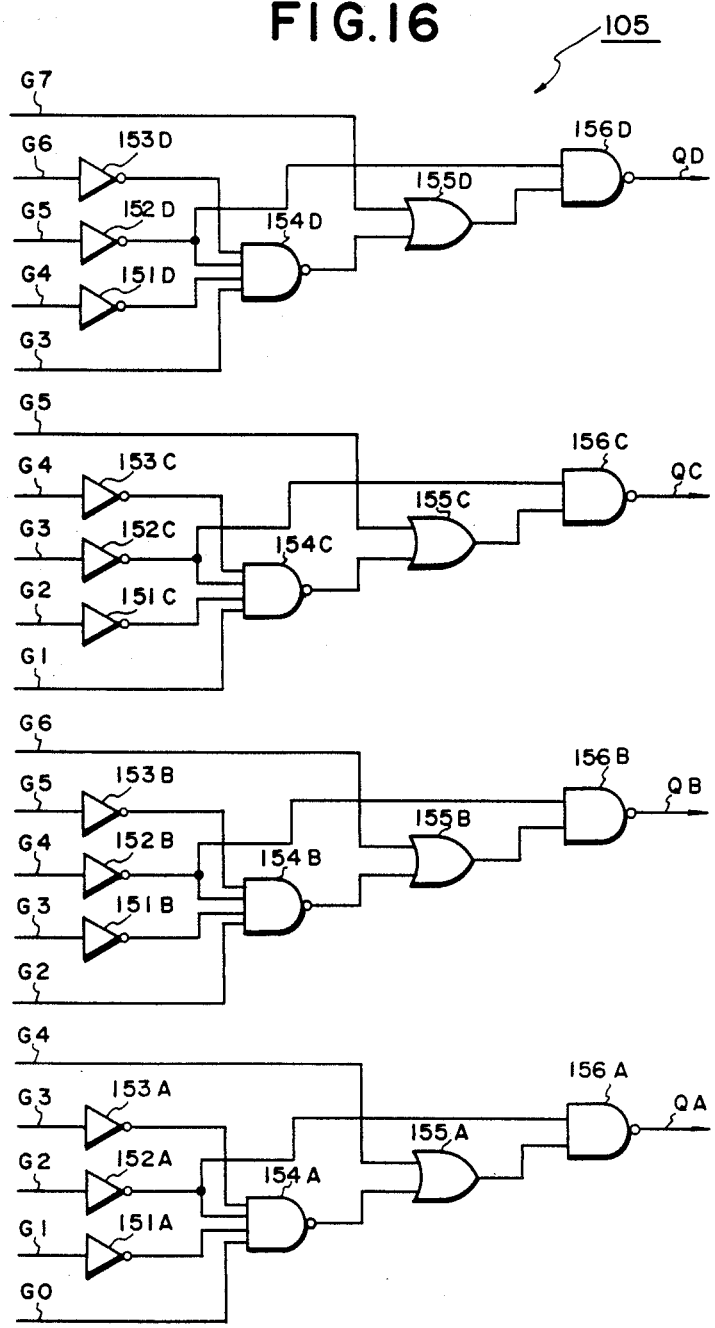
FIG. 16 is a block diagram showing a C-pattern detection circuit.

The C-pattern detection circuit 105, as shown in FIG. 16, decides whether or not the demodulated data G2 from the M² data QM2 and QM3 is the central bit in the C-pattern end using five-bit parallel data formed of the demodulated data G0–G4 out of the eight bits of the demodulated data G0–G7 received from the data demodulation circuit 104. If it is determined to be the central bit, the logical level of the NRZ data QA is set to a logical 1, otherwise the demodulated data G2 is output as NRZ data QA.

The demodulated data G1, G2, and G3 out of the demodulated data G0–G4 are passed through inverters 151A, 152A, and 153A, respectively, and input, together with the demodulated data G0, to separate inputs of a first NAND circuit 154A, the output of which is input, together with the demodulated data G4, to separate inputs of an OR circuit 155A. The output of the OR gate 155A is supplied, together with the output of the inverter 152A, to separate inputs of a NAND circuit 156A.

Thus, when the bits of the demodulated data G0, G1, G2, G3, and G4 are at logical 1, 0, 0, 0, 0 (that is, when they are C-pattern end), NRZ data QA becomes a logical 0, otherwise it becomes a logical 1. Hence, the output QA of the second NAND circuit 156A when the demodulated data G0–G4 corresponds to the C-pattern end becomes a logical 1 regardless of the logical level of the demodulated data G2, otherwise the output QA takes the same logical level as that of the demodulated data G2. In this way the result of the C-pattern end detection for the demodulated data G2 is obtained at the output terminal of the NAND circuit 156A, and in the event that the data corresponds to the C-pattern end, the NRZ data QA at a logical 1 is always obtained there.

As shown in FIG. 16, for the demodulated data G4, G3, and G5, the C-pattern end detection is executed in circuit arrangements similar to that aforementioned (these are shown with the last reference character "A" for the circuit arrangement for the demodulated data G2 changed to "B", "C", and "D", respectively), and if the data corresponds to the C-pattern end, the NRZ data QB, QC, or QD at a logical 1 is obtained.

Figure 15:
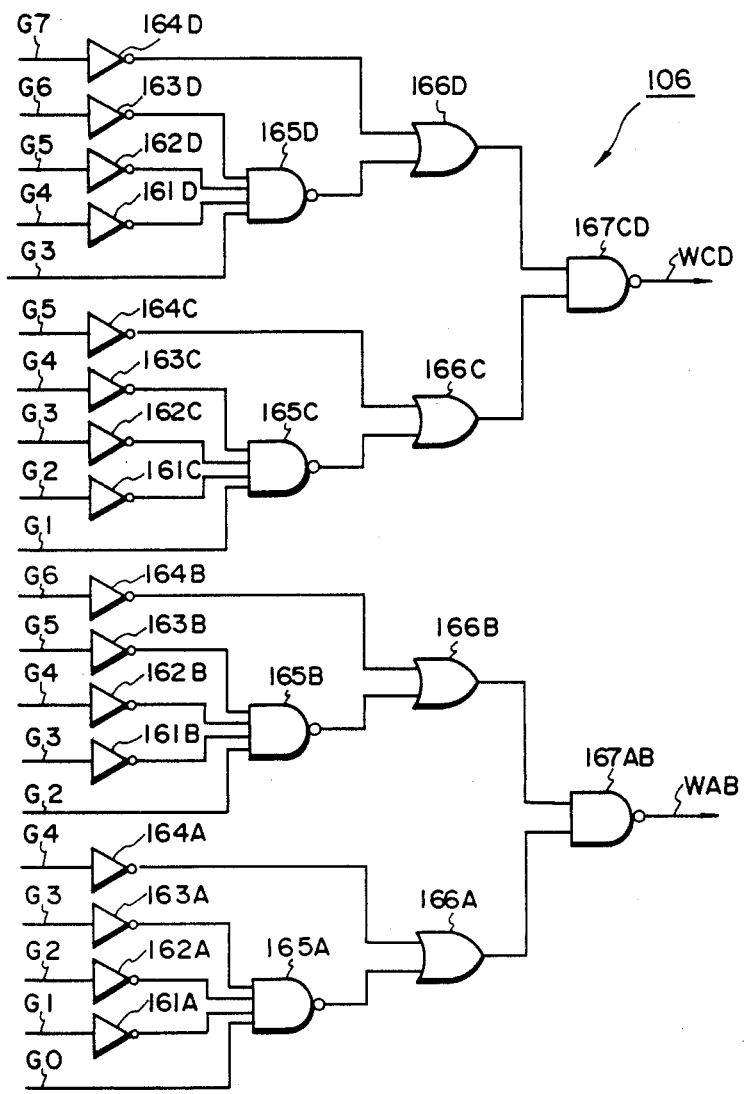
FIG. 15 is a block diagram showing a window detection circuit.

The window detection circuit 106, as shown in FIG. 15, outputs the first window detection output WAB at a logical 1 only when either the demodulated data G0–G4 or G2–G6 is at logical 1, 0, 0, 0, 1, respectively, and outputs the second window detection output WCD at a logical 1 only when either the demodulated data G1–G5 or G3–G7 is at logical 1, 0, 0, 0, 1, respectively. Incidentally, the first and second window detection outputs WAB and WCD are generated, dependent on the input conditions, in a manner so as not to become a logical 1 at the same time.

In order to achieve this, the demodulated data G1, G2, and G3 are passed through separate inverters 161A, 162A, and 163A, respectively, and input, together with the demodulated data G0, to separate inputs of a first NAND circuit 165A and the output thereof is supplied, together with the demodulated data G4 passed through an inverter 164A, to separate inputs of an OR circuit 166A. The output of the OR gate 166A is supplied to one input of a NAND circuit 167AB.

Thus, the output of the OR circuit 166A goes to a 0 level only when the demodulated data G0, G1, G2, G3, and G4 are at logical levels 1, 0, 0, 0, 1, respectively.

The demodulated data G2–G6 are treated by a similar circuit arrangement (which is shown with the last reference character for the corresponding parts changed to "B"), whereby it is that the output of a second OR circuit 166B goes to a 0 level only when the demodulated data G2, G3, G4, G5, and G6 are at logical levels 1, 0, 0, 0, 1, respectively, and the output is supplied to the NAND circuit 167AB.

Thus, the first window detection output WAB of the NAND circuit 167AB goes to a 1 level only when either the output of the OR circuits 166A or 166B is at a logical 0.

The second window detection output WCD goes to a 1 level when either the demodulated data G1, G2, G3, G4, and G5 or G3, G4, G5, G6, and G7 are at logical levels 1, 0, 0, 0, 1, respectively, as processed by similar circuit arrangements (which are shown with the last reference characters for the corresponding parts changed to "C" and "D", respectively).

Figure 17:
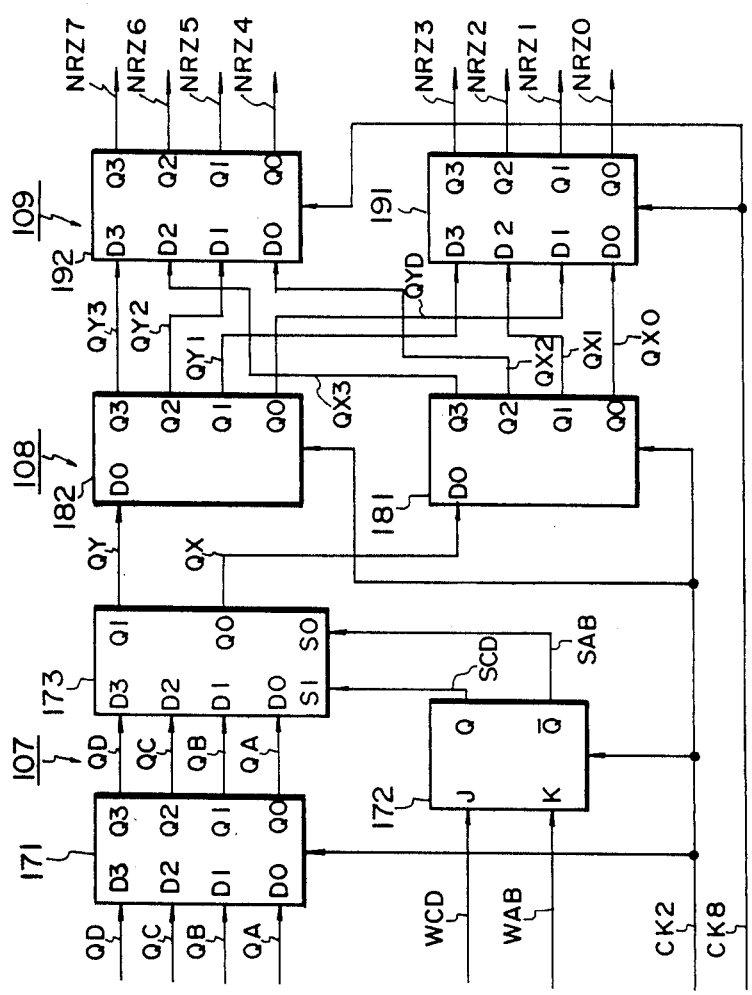
FIG. 17 is a block diagram showing a data select circuit, shift circuit, and an output data latch circuit

The data select circuit 107, as shown in FIG. 17, is made up of a latch circuit 171 of a four-bit structure, a selector circuit 172 of a JK flip-flop circuit structure, and a switching circuit 173.

The latch circuit 171 receives the four-bit NRZ data QA, QB, QC, and QD from the C-pattern detection circuit 105 and outputs the four-bit NRZ data QA, QB, QC, and QD to the switching circuit 173 at the timing of the rise of the first clock CK.

The selector circuit 172, based upon the first and second window detection outputs WAB and WCD input from the window detection circuit 106, generates first and second select signals SAB and SCD and outputs these signals to the select terminals S0 and S1 of the switching circuit 173 at the same timing as that for the latch circuit 171.

That is, if the first window detection output WAB is at a logical 1 and the second window detection output WCD is at a logical 0, the first select signal SAB is brought to a logical 1 and the second select signal SCD is brought to a logical 0, whereas if the first window detection output WAB is at a logical 0 and the second window detection output WCD is at a logical 1, the first select signal SAB is brought to a logical 0 and the second select signal SCD is brought to a logical 1.

If both the first and the second window detection outputs WAB and WCD are at a logical 0, the first and second select signals SAB and SCD maintain their previous logical levels.

If the first and second window detection outputs WAB and WCD are both at a logical 0 after the digital code demodulation circuit 101 has started its operation, the selector circuit 172 generates as initial values the first select signal SAB at a logical 1 and the second select signal SCD at a logical 0.

The switching circuit 173 operates, depending on the logical levels of the first and second select signals SAB and SCD input to the select terminals S0 and S1, such that when, for example, the first select signal SAB is at a logical 1, it causes the NRZ data QA and QB input to the first and second input terminals D0 and D1 to be output from first and second output terminals Q0 and Q1, whereas when the second select signal SCD is at a logical 1, it causes the NRZ data QC and QD input to the third and fourth input terminals D2 and D3 to be output from the first and second output terminals Q0 and Q1.

Thus, in the data select circuit 107, either the combination of the NRZ data QA and QB or that of QC and QD which is in the right window is selected from the four bits of the NRZ data QA, QB, QC, and QD output from the C-pattern detection circuit 105, dependent on the first and second window detection outputs WAB and WCD from the window detection circuit 106, and the selected data is output to the shift circuit 108.

The shift circuit 108 is made up of a first shift register 181 to which the first output data QX output from the first output terminal Q0 of the switching circuit 173 is input and a second shift register 182 to which the second output data QY output from the second output terminal Q1 is input.

The first and second shift registers 181 and 182, formed of a four-bit shift register, perform shifting operations at the timing of the rise of the first clock CK2 at which the first and second output data QX and QY are input thereto and output each of parallel data QX0, QX1, QX2, and QX3 and parallel data QY0, QY1, QY2 and QY3 to a first and a second latch circuits 191 and 192 of the output data latch circuit 109 at a timing such that four bits each are input to each of the shift registers 181 and 182.

Output terminals Q0, Q1, Q2, and Q3 of the first shift register 181 are connected, respectively, to input terminals D0 and D2 of the first latch circuit 191 and input terminals D0 and D2 of the second latch circuit 192, whereas output terminals Q0, Q1, Q, and Q3 of the second shift register 182 are connected, respectively, to input terminals D1 and D3 of the first latch circuit 191 and input terminals D1 and D3 of the second latch circuit 192.

Thus, with the arrangement as shown in FIG. 17, the $M^2$ data M0, M1, M2, and M3 provided from the $M^2$ data DMM in serial form passed through the serial-to-parallel conversion circuit 102 and input in synchronism with the timing of the rise of the first clock CK is sequentially processed in parallel at the timing of the first clock CK2 whereby two bits of the NRZ data QX and QY are obtained, and then the data is delivered through the shift circuit 108 to the output data latch circuit 109 to be latched thereby in synchronism with the timing of the rise of the second clock CK8 obtained by dividing the first clock CK2 by four, whereby NRZ data formed of eight-bit parallel data NRZ0-NRZ7 is obtained, and the data after being passed through the parallel-to-serial conversion circuit 110, is turned into the NRZ data DN in serial form.

According to the arrangement described above, $M^2$ data DMM input as serial data is first converted into parallel data to be processed in parallel, i.e. at the same time, for code conversion and then converted back to serial data, and the NRZ data DN is thereby obtained, whereby it is possible to parallel process data at processing speeds as slow as ½ and ⅛ of the clock frequency of the NRZ data DN.

In practice, while a 160 MHz clock frequency has been required in the input data latch circuit 103 for use with a digital VTR in the PAL system, the circuit according to the present invention can be operated just at the timing of the clock signal CK2 which is one-half of the clock signal CK (the clock frequency of the NRZ data in the present case is 80 MHz), i.e., of 40 MHz or so.

Similarly, the clock frequency for the data select circuit 107 and shift circuit 108 operating at the timing of the clock signal CK2 is 40 MHz.

In the output data latch circuit 109 operating at the timing of the clock signal CK8 obtained by dividing the clock signal by eight, the clock frequency required is 10 MHz.

Although the case where the $M^2$ data is successively cut into four-bit data was mentioned in the embodiment described above, the present invention is not limited to that but cutting the data into eight-bit data can also be practiced.

Further, although the case where the present invention is applied to a digital code modulation and demodulation circuit of a digital VTR was mentioned in the embodiment described above, the present invention is not limited to that, but it can be widely applied to other modulation schemes such as a PCM (pulse code modulation) modulation and demodulation circuit.

And further, although the case where the present invention is applied to a digital code modulation and demodulation circuit for the $M^2$ format was mentioned in the embodiment described above, the present invention is not limited to that but is widely applicable to other modulation schemes such as a digital code modulation and demodulation circuit for the MFM format.

According to the present invention as described in the foregoing, serial data successively incoming can be processed in parallel, i.e., at the same time, and therefore, input data even at a high repetition frequency can be easily modulated without using logical circuits capable of high-speed switching.

Therefore, the parallel processing circuits in the digital VTR with the digital code conversion apparatus applied thereto can be constructed of logical circuits of slower processing speeds. Hence, the portion which has heretofore only been possible to construct by using ECL digital circuits can, with the present invention, be constructed by the use, for example, of CMOS integrated circuits.

As a result, power consumption can be largely reduced, and so, it becomes possible to have the entire parallel circuit portion integrated into, for example, a CMOS integrated circuit. By so doing, a digital VTR of small power consumption and of small-sized, simple and economical construction as a whole can be easily obtained.

Figure 18:
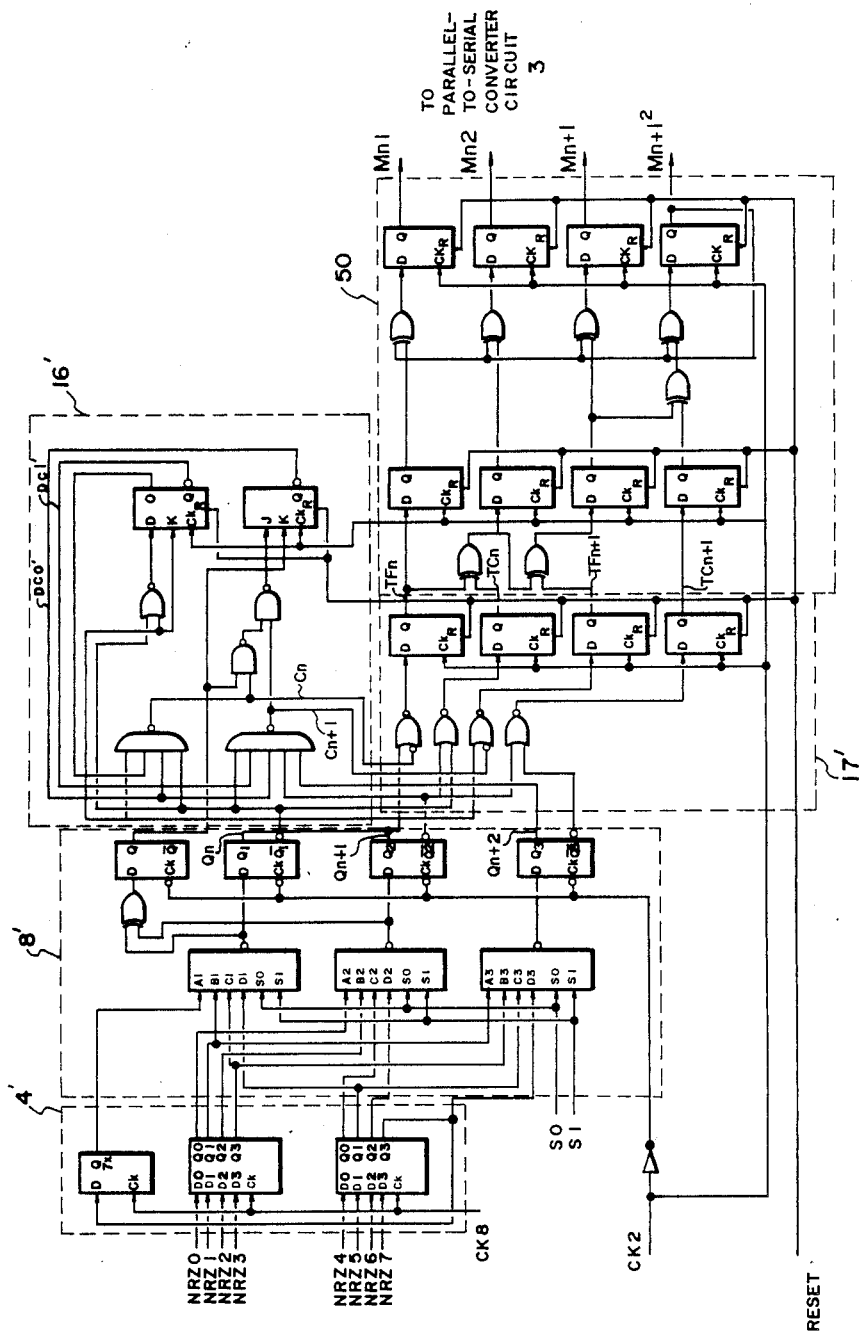
FIG. 18 is a schematic diagram of a modulator circuit according to the invention.

Referring to FIG. 18, in the circuit of FIGS. 3, 5, 9, in order to produce the transition between "0" and "0", the transition is caused at the front edge of the $Q_n$ by detecting the condition of the $Q_{n-1}$.

In the second embodiment, in order to produce the same transition between "0" and "0", the transition is caused at the trailing edge of the $Q_n$ by detecting the condition of the $Q_{n+1}$. Since the $Q_{n-1}$ is not employed, any more circuits, number of logic circuits are reduced.

Although the present invention has been shown and described with respect to preferred embodiments, various changes and modifications which are obvious to a person skilled in the art to which the invention pertains are deemed to lie within the spirit and scope of the invention.

What is claimed is:

1. A digital code conversion apparatus comprising:
serial-to-parallel converter means for receiving input data formed of serial data and for converting said input data at a first clock rate into parallel data which are shifted one after another by a first number of bits to thereby output parallel data in which a plurality of the parallel data output at the preceding and the following clock periods have a second number of bits of overlapped data;
code conversion means for detecting said second number of bits of overlapped data of said plurality of parallel data and converting said plurality of parallel data into a plurality of converted data in a conversion rule; and
parallel-to-serial conversion circuit means for converting said plurality of converted data obtained through said code conversion means into serial converted data.

2. A digital code conversion apparatus comprising:
first serial-to-parallel converter means for receiving input data formed of serial data and for converting the input data into first parallel data shifted by a first number of bits at a first clock rate to thereby output second parallel data having a form in which a plurality of the first parallel data output at the preceding and the following clock periods have a second number of bits of overlapped data with the second parallel data;
code conversion means which is responsive to said second parallel data for obtaining third parallel data and from it, outputting fourth parallel data formed of predetermined bits within said third parallel data; and
data conversion means for shifting said fourth parallel data by a third number of bits for obtaining fifth parallel data and converting said fifth parallel data into serial converted data.

3. A digital code conversion apparatus which comprises:
serial-to-parallel converter means for receiving input serial data, for converting the input data at a first clock rate into parallel data which are shifted one after another by a first number of bits, to thereby output a plurality of parallel data which, at the preceding and the following clock periods, have a second number of bits of overlapped data;

code conversion means for detecting the second number of bits of overlapped data of said plurality of parallel data and converting the plurality of parallel data into a plurality of converted data in a conversion rule; and parallel-to-serial conversion means for converting the plurality of converted data into serial converted data.

4. A digital code conversion apparatus which comprises first serial-to-parallel conversion means for receiving input data formed of serial data, for converting the input data into first parallel data shifted by a first number of bits at a first clock rate, and to thereby output second parallel data in which a plurality of the second parallel data output at the preceding and the following clock period have a second number of bits of overlapped data with the first parallel data;

code conversion means for detecting said second number of bits of overlapped data of said plurality of second parallel data and converting the plurality of second parallel data into third parallel data, and using the third parallel data for outputting fourth parallel data formed of bits within the third parallel data;

data conversion means for shifting the fourth parallel data by a third number of bits for obtaining fifth parallel data; and a parallel to serial converter for converting the fifth parallel data into serial converted data.

5. A digital code conversion apparatus as recited in claims 1, 2, 3, or 4 wherein the serial-to-parallel converter means receives as input data NRZ data.

6. A digital code conversion apparatus as recited in claim 5 wherein the input data is in synchronism with the timing of the rise of a clock signal from an external source.

7. A digital code conversion apparatus as recited in claims 1, 2, 3, or 4 wherein the parallel-to-serial converter outputs $M^2$ code data.

8. A digital code conversion apparatus as recited in claims 1, 2, 3, or 4 wherein the serial-to-parallel converter means cuts out eight-bit parallel data from the input data.

9. A digital code conversion apparatus as recited in claim 8 wherein the cut out eight-bit parallel data are processed in parallel according to the $M^2$ code by the code conversion means.

10. A method of digital code conversion comprising the steps of:

receiving input serial data;

converting the input data at a first clock rate into parallel data which are shifted one after another by a first number of bits, to thereby output parallel data in which a plurality of the parallel data output at the preceding and the following clock periods have a second number of bits of overlapped data;

detecting the second number of bits of overlapped data of said plurality of parallel data and converting the plurality of parallel data into a plurality of converted data in a conversion rule; and converting the plurality of converted data into serial converted data.

11. A method of digital code conversion comprising the steps of receiving input data formed of serial data;

converting the input data into first parallel data shifted by a first number of bits at a first clock rate;

outputting second parallel data having a form in which a plurality of the first parallel data output at the preceding and the following clock periods have a second number of bits of overlapped data with the first parallel data;

converting the second parallel data into third parallel data;

using the third parallel data, outputting fourth parallel data formed of predetermined bits within the third parallel data;

shifting the fourth parallel data by a third number of bits to obtain fifth parallel data; and converting the fifth parallel data into serial converted data.

12. A digital code conversion apparatus comprising:

serial-to-parallel conversion means for receiving input NRZ data DN and successively cutting it into eight-bit parallel data NRZ0–NRZ7, the NRZ data DN being clocked according to an external clock signal CK;

latch means for receiving the parallel data NRZ0–NRZ7 and outputting parallel data NRZ0–NRZ7 and the most significant bit NRZ6x and the bit NRZ7x, which were latched one clock period prior to the NRZ data DN, at the timing of a clock signal CK8 supplied from an external source which is one-eighth the frequency of the clock signal CK;

selector means for receiving the output of the latch means and cutting the parallel data NRZ0–NRZ7 into four-bit select data $Q_{n-1}$, $Q_n$, $Q_{n+1}$, $Q_{n+2}$, and sequentially shifting them by a two-bit interval with each one half of the intervals of the clock CK;

C-pattern detection means connected to the selector means for testing the two central bits $Q_n$ and $Q_{n+1}$ to determine whether or not they correspond to the last data whose logical level is at a logical 1 in the pattern C of the NRZ data DN, and based on the result of the test, generating transition information $TF_n$, $TC_n$, $TF_{n+1}$, $TC_{n+1}$ for the parallel data $Q_n$ and $Q_{n+1}$;

encoder and data conversion means connected to the selector means and to the C-pattern detection means for receiving the four-bit select data $Q_{n-1}$, $Q_n$, $Q_{n+1}$, $Q_{n+2}$ and the transition information $TF_n$, $TC_n$, $TF_{n+1}$, and $TC_{n+1}$, and in response thereto, dividing the corresponding two-bit data DMM into four bits through the division of one clock period into a front half and a rear half, to thereby output parallel $M^2$ data $M_n1$, $M_n2$, $M_{n+1}1$, and $M_{n+1}2$ representative of their logical levels; and parallel-to-serial conversion means supplied with the $M^2$ data $M_n1$, $M_n2$, $M_{n+1}1$, and $M_{n+1}2$ for converting them to $M^2$ serial data DMM.

13. A digital code demodulation apparatus for receiving serial $M^2$ data DMM and converting it to serial NRZ data DN comprising:

serial-to-parallel conversion means for receiving input $M^2$ data DMM, which is serial data obtained at the timing of the rise and fall of a fundamental clock CK for NRZ data DN and converting the same into four-bit $M^2$ data M0, M1, M2, and M3 provided at the timing of the rise of an externally supplied clock CK2 which is one-half the frequency of the clock CK;

input data latch means, including first and second latch circuits, each having four outputs, and a third latch circuit, for receiving the four-bit $M^2$ data M0, M1, M2, and M3 and latching it in the first latch circuit in synchronism with a rise of the clock CK2 and latching the outputs of the first latch circuit in the second latch circuit in synchronism with the succeeding rise of the first clock CK2, the outputs of the second latch circuit including an output Q3 which is latched in the third latch circuit in synchronism with the following rise of the first clock CK2, whereby, the input latch means outputs the four bits of the latch outputs of the first latch circuit, together with five bits of $M^2$ data previously latched in the second and third latch circuits, all together totaling nine bits of parallel data, QM0, QM1, QM2, QM3, QM4, QM5, QM6, QM7, and QM8;

data demodulation means, including a plurality of exclusive OR gate means connected to receive the outputs of the first, second and third latches to produce exclusive OR products of each pair of adjoining bits in the nine-bit parallel data QM0, QM1, ..., QM7, QM8 received from the input data latch means and thereby output 8-bit demodulated data G0, G1, G2, G3, G4, G5, G6, and G7, as the outputs of the exclusive OR means;

C-pattern detection means connected to the data demodulation means for determining whether or not the demodulated data G2, G4, G3 and G5 are the central bits in the C-pattern end using the two-bit parallel data before and after each of them for a total of 5-bit parallel data, i.e. G0–G4, G2–G6, G3–G7, respectively, and if each one, in turn, is determined to be a central bit, NRZ data QA, QB, QC, and QD, respectively, is generated each having a logical level set to a logical 1, otherwise in each case the demodulated data G2, G4, G3 and G5 are output as NRZ data QA, QB, QC, and QD, respectively;

window detection means connected to the data demodulation means for outputting a first window detection output WAB at a logical 1 only when either the demodulated data G0–G4 or G2–G6 is at logical 1, 0, 0, 0, 1, respectively, and outputting a second window detection output WCD at a logical 1 only when either the demodulated data G1–G5 or G3–G7 is at logical 1, 0, 0, 0, 1, respectively;

data select means connected to the C-pattern detection means and the window detection means for selecting either the combination of the NRZ data QA and QB or that of QC and QD which is in the right window from the four bits of the NRZ data QA, QB, QC, and QD output from the C-pattern detection means in response to the first and second window detection outputs WAB and WCD from the window detection means and outputting the selected data as two bits of NRZ data QX, QY;

shift means, supplied with the data QX, QY, and including a first shift register to which the first output data QX is input and a second shift register to which the second output data QY is input, for performing shifting operations at the timing of the rise of the first clock CK2 at which the first and second output data QX and QY are input thereto such that four bits each are input to each of the shift registers, the first shift register having multiple outputs for separately outputting each of parallel data QX0, QX1, QX2, and QX3 and the second shift register having multiple outputs for outputting parallel data QY0, QY1, QY2 and QY3;

output data latch means, including a first and a second latch means for receiving the separately output parallel data QX0, QX1, QX2, and QX3 and QY0, QY1, QY2 and QY3, respectively, latching it in synchronism with the timing of the rise of the second clock CK8 obtained by dividing the first clock CK2 by four, and then outputting corresponding NRZ data formed of eight-bit parallel data NRZ0–NRZ7; and parallel-to-serial conversion means supplied with the eight-bit parallel data NRZ0–NRZ7 for demodulating it to become serial NRZ data DN at the timing of the rise of the fundamental clock CK.

14. A digital code demodulation apparatus, in combination with the digital code conversion apparatus as recited in claims 1, 3 or 12 for receiving the input serial data (DMM) and converting it back into serial NRZ data DN comprising:

serial-to-parallel conversion means for receiving input $M^2$ data DMM, which is serial data obtained at the timing of the rise and fall of a fundamental clock CK for NRZ data DN and converting the same into four-bit $M^2$ data M0, M1, M2, and M3 provided at the timing of the rise of an externally supplied clock CK2 which is one-half the frequency of the clock CK;

input data latch means, including first and second latch circuits, each having four outputs, and a third latch circuit, for receiving the four-bit $M^2$ data M0, M1, M2, and M3 and latching it in the first latch circuit in synchronism with a rise of the clock CK2 and latching the outputs of the first latch circuit in the second latch circuit in synchronism with the succeeding rise of the first clock CK2, the outputs of the second circuit including an output Q3 which is latched in the third latch circuit in synchronism with the following rise of the first clock CK2, whereby, the input latch means outputs the four bits of the latch outputs of the first latch circuit, together with five bits of $M^2$ data previously latched in the second and third latch circuits, all together totaling nine bits of parallel data, QM0, QM1, QM2, QM3, QM4, QM5, QM6, QM7, and QM8;

data demodulation means, including a plurality of exclusive OR gate means connected to receive the outputs of the first, second and third latches to produce exclusive OR products of each pair of adjoining bits in the nine-bit parallel data QM0, QM1, ..., QM7, QM8 received from the inputs data latch means and thereby output 8-bit demodulated data G0, G1, G2, G3, G4, G5, G6, and G7, as the outputs of the exclusive OR means;

C-pattern detection means connected to the data demodulation means for determining whether or not the demodulated data G2, G4, G3 and G5 are the central bits in the C-pattern end using the two-bit parallel data before and after each of them for a total of 5-bit parallel data, i.e. G0–G4, G2–G6, G3–G7, respectively, and if each one, in turn, is determined to be a central bit, NRZ data QA, QB, QC, and QD, respectively, is generated each having a logical level set to a logical 1, otherwise in each case the demodulated data G2, G4, G3 and G5 are output as NRZ data QA, QB, QC, and QD, respectively;

window detection means connected to the data demodulation means for outputting a first window detection output WAB at a logical 1 only when either the demodulated data G0-G4 or G2-G6 is at logical 1, 0, 0, 0, 1, respectively, and outputting a second window detection output WCD at a logical 1 only when either the demodulated data G1-G5 or G3-G7 is at logical 1, 0, 0, 0, 1, respectively;

data select means connected to the C-pattern detection means and the window detection means for selecting either the combination of the NRZ data QA and QB or that of QC and QD which is in the right window from the four bits of the NRZ data QA, QB, QC, and QD output from the C-pattern detection means in response to the first and second window detection outputs WAB and WCD from the window detection means and outputting the selected data as two bits of NRZ data QX, QY;

shift means, supplied with the data QX, QY, and including a first shift register to which the first output data QX is input and a second shift register to which the second output data QY is input, for performing shifting operations at the timing of the rise of the first clock CK2 at which the first and second output data QX and QY are input thereto such that four bits each are input to each of the shift registers, the first shift register having multiple outputs for separately outputting each of parallel data QX0, QX1, QX2, and QX3 and the second shift register having multiple outputs for outputting parallel data QY0, QY1, QY2 and QY3;

output data latch means, including a first and a second latch means for receiving the separately output parallel data QX0, QX1, QX2, and QX3 and QY0, QY1, QY2 and QY3, respectively, latching it in synchronism with the timing of the rise of the second clock CK8 obtained by dividing the first clock CK2 by four, and then outputting corresponding NRZ data formed of eight-bit parallel data NRZ0-NRZ7; and parallel-to-serial conversion means supplied with the eight-bit parallel data NRZ0-NRZ7 for demodulating it to become serial NRZ data DN at the timing of the rise of the fundamental clock CK.

* * * * *